United States Patent
Jung et al.

(10) Patent No.: US 9,257,169 B2
(45) Date of Patent: Feb. 9, 2016

(54) MEMORY DEVICE, MEMORY SYSTEM, AND OPERATING METHODS THEREOF

(71) Applicants: Bu Il Jung, Hwaseong-si (KR); So Young Kim, Hwaseong-si (KR)

(72) Inventors: Bu Il Jung, Hwaseong-si (KR); So Young Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 372 days.

(21) Appl. No.: 13/836,659

(22) Filed: Mar. 15, 2013

(65) Prior Publication Data

US 2013/0304982 A1 Nov. 14, 2013

Related U.S. Application Data

(60) Provisional application No. 61/646,410, filed on May 14, 2012.

(30) Foreign Application Priority Data

Aug. 24, 2012 (KR) ........................ 10-2012-0093113

(51) Int. Cl.
  G11C 11/40 (2006.01)
  G11C 11/403 (2006.01)
  G11C 11/406 (2006.01)

(52) U.S. Cl.
  CPC ........ *G11C 11/403* (2013.01); *G11C 11/40615* (2013.01); *G11C 11/40622* (2013.01)

(58) Field of Classification Search
  CPC ........... G11C 13/0033; G11C 13/0335; G11C 14/3418; G11C 14/3422; G11C 14/3427; G11C 11/403; G11C 11/406; G11C 11/40622
  See application file for complete search history.

(56) References Cited

U.S. PATENT DOCUMENTS

| 4,839,867 | A | * | 6/1989 | Poehnitzsch | G11C 11/406 365/194 |
| --- | --- | --- | --- | --- | --- |
| 5,715,193 | A | * | 2/1998 | Norman | 365/185.02 |
| 5,889,698 | A | * | 3/1999 | Miwa et al. | 365/185.03 |
| 6,965,537 | B1 | * | 11/2005 | Klein | G06F 11/106 365/200 |
| 7,325,089 | B2 | | 1/2008 | Swaminathan | |
| 7,836,374 | B2 | * | 11/2010 | Klein | G11C 7/20 714/754 |
| 2004/0170060 | A1 | | 9/2004 | Ishimoto | |
| 2005/0099868 | A1 | * | 5/2005 | Oh | G11C 11/406 365/222 |
| 2006/0198226 | A1 | * | 9/2006 | Takahashi et al. | 365/222 |
| 2007/0014174 | A1 | * | 1/2007 | Ohsawa | G11C 11/406 365/222 |
| 2008/0165605 | A1 | * | 7/2008 | Fisch et al. | 365/222 |

FOREIGN PATENT DOCUMENTS

| JP | 2005332497 A | 12/2005 |
| --- | --- | --- |
| JP | 2007095110 A | 4/2007 |
| KR | 20000066944 A | 11/2000 |

* cited by examiner

*Primary Examiner* — Sanjiv Shah
*Assistant Examiner* — Rocio Del Mar Perez-Velez
(74) *Attorney, Agent, or Firm* — Harness, Dickey & Pierce, P.L.C.

(57) ABSTRACT

A memory device, a memory system, and operating methods thereof are provided. The method of operating the memory device, which includes a first memory cell and a second memory cell neighboring the first memory cell, includes counting a disturbance value of the second memory cell each time the first memory cell is accessed, updating a disturbance count value of the second memory cell based on the counting, adjusting a refresh schedule based on the disturbance count value of the second memory cell, a desired threshold and a maximum disturbance count value, and resetting the disturbance count value of the second memory cell and the maximum disturbance count value when the second memory cell is refreshed according to the adjusted refresh schedule.

34 Claims, 24 Drawing Sheets

| Command | x | 0 | 1 | 2 | 3 | 4 | 5 | 6 | 7 | 8 |
|---|---|---|---|---|---|---|---|---|---|---|
| Access 3,6 | T=0 | 0,0 | 0,0 | 0,0 | 0,0 | 0,0 | 0,0 | 0,0 | 0,0 | 0,0 |
| Access 3,6 | T=1 | 0,0 | 0,0 | 0,0 | 1,1 | 0,0 | 0,0 | 0,0 | 0,0 | 0,0 |
| Access 3,6 | T=2 | 0,0 | 0,0 | 0,0 | 1,1 | 0,0 | 0,0 | 1,1 | 0,0 | 0,0 |
| Access 3,6 | T=3~159 | 0,0 | 0,0 | 0,0 | ... | 0,0 | 0,0 | ... | 0,0 | 0,0 |
| Access 3,6 | T=160 | 0,0 | 0,0 | 0,0 | 80,80 | 0,0 | 0,0 | 80,80 | 0,0 | 0,0 |
| Refresh - | | 0,0 | 0,0 | 0,0 | 80,80 | 0,0 | 0,0 | 80,80 | 0,0 | 0,0 |
| Access 3,6 | T=320 | 0,0 | 0,0 | 0,0 | 160,160 | 0,0 | 0,0 | 160,160 | 0,0 | 0,0 |
| Refresh 2 | | 0,0 | | 0,0 | 0,160 | 0,0 | 0,0 | 240,240 | 0,0 | 0,0 |
| Access 3,6 | T=480 | 0,0 | | 0,0 | 80,240 | 0,0 | 0,0 | 240,240 | | 0,0 |
| Refresh 4 | | | | | 80,0 | | | | | |
| Access 3,6 | T=640 | 0,0 | | 0,0 | 160,80 | 0,0 | 0,0 | 320,320 | 0,0 | 0,0 |
| Refresh 5 | | | | | 160,80 | | | 0,320 | | | x=2 Disturb, x=4 Disturb    x=5 Disturb, x=7 Disturb

Threshold = 159, 2 ROW (x=3 & x=6) Semi-intensive Access

FIG. 9A

| Command | x | 0 | 1 | 2 | 3 | 4 | 5 | 6 | 7 | 8 | Effective 4 |
|---|---|---|---|---|---|---|---|---|---|---|---|
| Access 3,5 | T=0 | 0,0 | 0,0 | 0,0 | 0,0 | 0,0 | 0,0 | 0,0 | 0,0 | 0,0 | 0 |
| Access 3,5 | T=1 | 0,0 | 0,0 | 0,0 | 1,1 | 0,0 | 0,0 | 0,0 | 0,0 | 0,0 | 1 |
| Access 3,5 | T=2 | 0,0 | 0,0 | 0,0 | 1,1 | 0,0 | 1,1 | 0,0 | 0,0 | 0,0 | 2 |
| Access 3,5 | T=3~159 | 0,0 | 0,0 | 0,0 | ... | 0,0 | 0,0 | 0,0 | 0,0 | 0,0 | ... |
| Access 3,5 | T=160 | 0,0 | 0,0 | 0,0 | 80,80 | 0,0 | 80,80 | 0,0 | 0,0 | 0,0 | 160 |
| Refresh – | | 0,0 | 0,0 | 0,0 | 80,80 | 0,0 | 80,80 | 0,0 | 0,0 | 0,0 | 160 |
| Access 3,5 | T=320 | 0,0 | 0,0 | 0,0 | 160,160 | 0,0 | 160,160 | 0,0 | 0,0 | 0,0 | 320 |
| Refresh 2 | | | | 0,0 | 0,160 | 0,0 | 160,160 | 0,0 | 0,0 | | 320 |
| Access 3,5 | T=480 | 0,0 | 0,0 | 0,0 | 80,240 | 0,0 | 240,240 | 0,0 | 0,0 | 0,0 | (480) |
| Refresh 4 | | | | 0,0 | 80,0 | | 240,240 | 0,0 | 0,0 | | 0 |
| Access 3,5 | T=640 | 0,0 | 0,0 | 0,0 | 160,80 | 0,0 | 320,320 | 0,0 | 0,0 | 0,0 | 160 |
| Refresh 4 | | | | 0,0 | 160,80 | | 0,320 | 0,0 | 0,0 | | 0 |

Threshold = 159, 2 ROW (x=3 & x=5) Semi-intensive Access, Superposed Disturb x=2 Disturb, x=4 Disturb    x=4 Disturb, x=6 Disturb

FIG. 10A

| Command | x | 0 | 1 | 2 | 3 | 4 | 5 | 6 | 7 | 8 |
|---|---|---|---|---|---|---|---|---|---|---|
| Access 1,4,7 | T=0 | 0,0 | 0,0 | 0,0 | 0,0 | 0,0 | 0,0 | 0,0 | 0,0 | 0,0 |
| Access 1,4,7 | T=1 | 0,0 | 1,1 | 0,0 | 0,0 | 0,0 | 0,0 | 0,0 | 0,0 | 0,0 |
| Access 1,4,7 | T=2 | 0,0 | 1,1 | 0,0 | 0,0 | 1,1 | 0,0 | 0,0 | 0,0 | 0,0 |
| Access 1,4,7 | T=3 | 0,0 | 1,1 | 0,0 | 0,0 | 1,1 | 0,0 | 0,0 | 1,1 | 0,0 |
| Access 1,4,7 | T=4~159 | 0,0 | ... | 0,0 | 0,0 | ... | 0,0 | 0,0 | ... | 0,0 |
| Access 1,4,7 | T=160 | 0,0 | 54,54 | 0,0 | 0,0 | 53,53 | 0,0 | 0,0 | 53,53 | 0,0 |
| Refresh – |  | 0,0 | 54,54 | 0,0 | 0,0 | 53,53 | 0,0 | 0,0 | 53,53 | 0,0 |
| Access 1,4,7 | T=320 | 0,0 | 107,107 | 0,0 | 0,0 | 107,107 | 0,0 | 0,0 | 106,106 | 0,0 |
| Refresh – |  | 0,0 | 107,107 | 0,0 | 0,0 | 107,107 | 0,0 | 0,0 | 106,106 | 0,0 |
| Access 1,4,7 | T=480 | 0,0 | 160,160 | 0,0 | 0,0 | 160,160 | 0,0 | 0,0 | 160,160 | 0,0 |
| Refresh 0 |  |  | 0,160 |  |  | 160,160 |  |  | 160,160 |  |
| Access 1,4,7 | T=640 | 0,0 | 54,214 | 0,0 | 0,0 | 213,213 | 0,0 | 0,0 | 213,213 | 0,0 |
| Refresh 2 |  |  | 54,0 |  |  | 213,213 |  |  | 213,213 |  |
| Access 1,4,7 | T=800 | 0,0 | 107,54 | 0,0 | 0,0 | 267,267 | 0,0 | 0,0 | 266,266 | 0,0 |
| Refresh 3 |  |  | 107,54 |  |  | 0,267 |  |  | 266,266 |  |

Threshold = 159, 3 ROW (x=1, 4, 7) Semi-intensive Access

FIG. 10B

| Command | x | 0 | 1 | 2 | 3 | 4 | 5 | 6 | 7 | 8 |
|---|---|---|---|---|---|---|---|---|---|---|
| Access 1,4,7 | T=960 | 0,0 | 160,107 | 0,0 | 0,0 | 53,320 | 0,0 | 0,0 | 320,320 | 0,0 |
| Refresh 5 | | 0,0 | 160,107 | | | 53,0 | | | 320,320 | |
| Access 1,4,7 | T=1120 | 0,0 | 214,161 | 0,0 | 0,0 | 106,53 | 0,0 | 0,0 | 373,373 | 0,0 |
| Refresh 6 | | | 214,161 | | | 106,53 | | | 0,373 | |
| Access 1,4,7 | T=1280 | 0,0 | 267,214 | 0,0 | 0,0 | 160,107 | 0,0 | 0,0 | 53,(426) | 0,0 |
| Refresh 8 | | | 267,214 | | | 160,107 | | | 53,0 | |
| Access 1,4,7 | T=1440 | 0,0 | 320,267 | 0,0 | 0,0 | 213,160 | 0,0 | 0,0 | 107,54 | 0,0 |
| Refresh 0 | | | 0,267 | | | 213,160 | | | 107,54 | |
| Access 1,4,7 | T=1600 | 0,0 | 54,321 | 0,0 | 0,0 | 266,213 | 0,0 | 0,0 | 160,107 | 0,0 |
| Refresh 2 | | | 54,0 | | | 266,213 | | | 160,107 | |
| Access 1,4,7 | T=1760 | 0,0 | 107,53 | 0,0 | 0,0 | 320,267 | 0,0 | 0,0 | 213,160 | 0,0 |
| Refresh 3 | | | 107,53 | | | 0,267 | | | 213,160 | |
| Access 1,4,7 | T=1920 | 0,0 | 160,106 | 0,0 | 0,0 | 53,320 | 0,0 | 0,0 | 267,214 | 0,0 |
| Refresh 5 | | | 160,106 | | | 53,0 | | | 267,214 | |
| Access 1,4,7 | T=2080 | 0,0 | 214,160 | 0,0 | 0,0 | 106,53 | 0,0 | 0,0 | 320,267 | 0,0 |
| Refresh 6 | | | 214,160 | | | 106,53 | | | 0,267 | |
| Access 1,4,7 | T=2240 | 0,0 | 267,213 | 0,0 | 0,0 | 160,107 | 0,0 | 0,0 | 53,320 | 0,0 |
| Refresh 8 | | | 267,213 | | | 160,107 | | | 53,0 | |

Repeat

Threshold = 159, 3 ROW (x=1, 4, 7) Semi-intensive Access

FIG. 11A

| Command | x | 0 | 1 | 2 | 3 | 4 | 5 | 6 | 7 | 8 | E2 | E4 | E6 |
|---|---|---|---|---|---|---|---|---|---|---|---|---|---|
| Access 1,3,5,7 | T=0 | 0,0 | 0,0 | 0,0 | 0,0 | 0,0 | 0,0 | 0,0 | 0,0 | 0,0 | 0 | 0 | 0 |
| Access 1,3,5,7 | T=1 | 0,0 | 1,1 | 0,0 | 0,0 | 0,0 | 0,0 | 0,0 | 0,0 | 0,0 | 0 | 0 | 0 |
| Access 1,3,5,7 | T=2 | 0,0 | 1,1 | 0,0 | 1,1 | 0,0 | 0,0 | 0,0 | 0,0 | 0,0 | 1 | 1 | 0 |
| Access 1,3,5,7 | T=3 | 0,0 | 1,1 | 0,0 | 1,1 | 0,0 | 1,1 | 0,0 | 0,0 | 0,0 | 2 | 2 | 1 |
| Access 1,3,5,7 | T=4 | 0,0 | 1,1 | 0,0 | 1,1 | 0,0 | 1,1 | 0,0 | 1,1 | 0,0 | 2 | 2 | 2 |
| Access 1,3,5,7 | T=4~159 | 0,0 | ... | 0,0 | ... | 0,0 | ... | 0,0 | ... | 0,0 | ... | ... | ... |
| Access 1,3,5,7 | T=160 | 0,0 | 40,40 | 0,0 | 40,40 | 0,0 | 40,40 | 0,0 | 40,40 | 0,0 | 80 | 80 | 80 |
| Refresh – | | 0,0 | 40,40 | 0,0 | 40,40 | 0,0 | 40,40 | 0,0 | 40,40 | 0,0 | 80 | 80 | 80 |
| Access 1,3,5,7 | T=320 | 0,0 | 80,80 | 0,0 | 80,80 | 0,0 | 80,80 | 0,0 | 80,80 | 0,0 | 160 | 160 | 160 |
| Refresh – | | 0,0 | 80,80 | 0,0 | 80,80 | 0,0 | 80,80 | 0,0 | 80,80 | 0,0 | 160 | 160 | 160 |
| Access 1,3,5,7 | T=480 | 0,0 | 120,120 | 0,0 | 120,120 | 0,0 | 120,120 | 0,0 | 120,120 | 0,0 | 240 | 240 | 240 |
| Refresh – | | 0,0 | 120,120 | 0,0 | 120,120 | 0,0 | 120,120 | 0,0 | 120,120 | 0,0 | 240 | 240 | 240 |
| Access 1,3,5,7 | T=640 | 0,0 | 160,160 | 0,0 | 160,160 | 0,0 | 160,160 | 0,0 | 160,160 | 0,0 | 320 | 320 | 320 |
| Refresh 0 | | 0,0 | 0,160 | 0,0 | 160,160 | 0,0 | 160,160 | 0,0 | 160,160 | 0,0 | 320 | 320 | 320 |
| Access 1,3,5,7 | T=800 | 0,0 | 200,200 | 0,0 | 200,200 | 0,0 | 200,200 | 0,0 | 200,200 | 0,0 | 400 | 400 | 400 |
| Refresh 2 | | 0,0 | 40,0 | 0,0 | 200,200 | 0,0 | 200,200 | 0,0 | 200,200 | 0,0 | 0 | 400 | 400 |

Threshold = 159, 4 ROW (x=1,3,5,7) Semi-intensive Access, Superposed Disturb

FIG. 11B

| Command | x | 0 | 1 | 2 | 3 | 4 | 5 | 6 | 7 | 8 | E2 | E4 | E6 |
|---|---|---|---|---|---|---|---|---|---|---|---|---|---|
| Access 1,3,5,7 | T=960 | 0,0 | 80,40 | 0,0 | 240,240 | 0,0 | 240,240 | 0,0 | 240,240 | 0,0 | 80 | 480 | 480 |
| Refresh 2 | | 0,0 | 80,40 | 0,0 | 0,240 | 0,0 | 240,240 | 0,0 | 240,240 | 0,0 | 0 | 480 | 480 |
| Access 1,3,5,7 | T=1120 | 0,0 | 120,80 | 0,0 | 40,280 | 0,0 | 280,280 | 0,0 | 280,280 | 0,0 | 80 | 560 | 560 |
| Refresh 4 | | 0,0 | 120,80 | 0,0 | 40,0 | 0,0 | 280,280 | 0,0 | 280,280 | 0,0 | 80 | 0 | 560 |
| Access 1,3,5,7 | T=1280 | 0,0 | 160,120 | 0,0 | 80,40 | 0,0 | 320,320 | 0,0 | 320,320 | 0,0 | 160 | 80 | 640 |
| Refresh 4 | | 0,0 | 160,120 | 0,0 | 80,40 | 0,0 | 0,320 | 0,0 | 320,320 | 0,0 | 160 | 0 | 640 |
| Access 1,3,5,7 | T=1440 | 0,0 | 200,160 | 0,0 | 120,80 | 0,0 | 40,360 | 0,0 | 360,360 | 0,0 | 240 | 80 | (720) |
| Refresh 6 | | 0,0 | 200,160 | 0,0 | 120,80 | 0,0 | 40,0 | 0,0 | 360,360 | 0,0 | 240 | 80 | 0 |
| Access 1,3,5,7 | T=1600 | 0,0 | 240,200 | 0,0 | 160,120 | 0,0 | 80,40 | 0,0 | 400,400 | 0,0 | 320 | 160 | 80 |
| Refresh 6 | | 0,0 | 240,200 | 0,0 | 160,120 | 0,0 | 80,40 | 0,0 | 0,440 | 0,0 | 320 | 160 | 0 |
| Access 1,3,5,7 | T=1760 | 0,0 | 280,240 | 0,0 | 200,160 | 0,0 | 120,80 | 0,0 | 40,480 | 0,0 | 400 | 240 | 80 |
| Refresh 8 | | 0,0 | 280,240 | 0,0 | 200,160 | 0,0 | 120,80 | 0,0 | 40,0 | 0,0 | 400 | 240 | 80 |

Threshold = 159, 4 ROW (x=1,3,5,7) Semi-intensive Access Superposed Disturb

FIG. 11C

| Command | x | 0 | 1 | 2 | 3 | 4 | 5 | 6 | 7 | 8 | E2 | E4 | E6 |
|---|---|---|---|---|---|---|---|---|---|---|---|---|---|
| Access 1,3,5,7 | T=1920 | 0,0 | 320,280 | 0,0 | 240,200 | 0,0 | 160,120 | 0,0 | 80,40 | 0,0 | 480 | 320 | 160 |
| Refresh 0 | | 0,0 | 0,280 | 0,0 | 240,200 | 0,0 | 160,120 | 0,0 | 80,40 | 0,0 | 480 | 320 | 160 |
| Access 1,3,5,7 | T=2080 | 0,0 | 40,320 | 0,0 | 280,240 | 0,0 | 200,160 | 0,0 | 120,80 | 0,0 | (560) | 400 | 240 |
| Refresh 2 | | 0,0 | 40,0 | 0,0 | 280,240 | 0,0 | 200,160 | 0,0 | 120,80 | 0,0 | 0 | 400 | 240 |
| Access 1,3,5,7 | T=2240 | 0,0 | 80,40 | 0,0 | 320,280 | 0,0 | 240,200 | 0,0 | 160,120 | 0,0 | 80 | 480 | 320 |
| Refresh 2 | | 0,0 | 80,40 | 0,0 | 0,280 | 0,0 | 240,200 | 0,0 | 160,120 | 0,0 | 0 | 480 | 320 |
| Access 1,3,5,7 | T=2400 | 0,0 | 120,80 | 0,0 | 40,320 | 0,0 | 280,240 | 0,0 | 200,160 | 0,0 | 80 | (560) | 400 |
| Refresh 4 | | 0,0 | 120,80 | 0,0 | 40,0 | 0,0 | 280,240 | 0,0 | 200,160 | 0,0 | 80 | 0 | 400 |
| Access 1,3,5,7 | T=2560 | 0,0 | 160,120 | 0,0 | 80,40 | 0,0 | 320,280 | 0,0 | 240,200 | 0,0 | 160 | 80 | 480 |
| Refresh 4 | | 0,0 | 160,120 | 0,0 | 80,40 | 0,0 | 0,280 | 0,0 | 240,200 | 0,0 | 160 | 0 | 480 |
| Access 1,3,5,7 | T=2720 | 0,0 | 200,160 | 0,0 | 120,80 | 0,0 | 40,320 | 0,0 | 280,240 | 0,0 | 240 | 80 | (560) |
| Refresh 6 | | 0,0 | 200,160 | 0,0 | 120,80 | 0,0 | 40,0 | 0,0 | 280,240 | 0,0 | 240 | 80 | 0 |
| Access 1,3,5,7 | T=2880 | 0,0 | 240,200 | 0,0 | 160,120 | 0,0 | 80,40 | 0,0 | 320,280 | 0,0 | 320 | 160 | 80 |
| Refresh 6 | | 0,0 | 240,200 | 0,0 | 160,120 | 0,0 | 80,40 | 0,0 | 0,280 | 0,0 | 320 | 160 | 0 |
| Access 1,3,5,7 | T=3040 | 0,0 | 280,240 | 0,0 | 200,160 | 0,0 | 120,80 | 0,0 | 40,320 | 0,0 | 400 | 240 | 80 |
| Refresh 8 | | 0,0 | 280,240 | 0,0 | 200,160 | 0,0 | 120,80 | 0,0 | 40,0 | 0,0 | 400 | 240 | 80 |

Repeat

Threshold = 159, 4 ROW (x=1,3,5,7) Semi-intensive Access, Superposed Disturb

MEMORY DEVICE, MEMORY SYSTEM, AND OPERATING METHODS THEREOF

CROSS-REFERENCE TO RELATED APPLICATIONS

This application claims priority under 35 U.S.C. §119(a) from U.S. Provisional Patent Application No. 61/646,410 filed on May 14, 2012, and Korean Patent Application No. 10-2012-0093113 filed on Aug. 24, 2012, the disclosures of each of which are hereby incorporated by reference in their entirety.

BACKGROUND

Some example embodiments of inventive concepts relate to a memory device, and more particularly, to a memory device and/or memory system configured to reduce deterioration of a dynamic refresh characteristic caused by a disturbance occurring during access to a memory cell by controlling a refresh operation and/or operating methods thereof.

A high voltage is applied to a word line of a semiconductor memory device, such as a dynamic random access memory (DRAM), to enable a transistor to access a memory cell. However, an electric field generated by the high voltage may decrease a threshold voltage of an access transistor in an adjacent cell. As a result, leakage current of a cell increases, which is called a pass gate effect. In order to prevent data loss due to the leakage current, DRAM requires a refresh operation of reading data from a cell and rewriting the data to the cell before the data stored in the cell is completely lost The refresh operation may be periodically performed in DRAM or may be performed at the request of a system.

Refresh characteristics include a static refresh characteristic and a dynamic refresh characteristic. A time gap between a first refresh operation on a cell in a memory cell array and a second refresh operation on the cell is referred to as a refresh interval.

The static refresh characteristic is the refresh characteristic of a cell when there are a small number of accesses or no accesses to DRAM during the refresh interval. The dynamic refresh characteristic is the refresh characteristic of a cell when there are relatively more accesses to DRAM than in the case of the static refresh characteristic.

A cell is less influenced by an adjacent cell or line and less influenced by power noise occurring when another cell is accessed in a static refresh than in a dynamic refresh. On the contrary, since there are frequent accesses to DRAM in the dynamic refresh, the influence on an adjacent cell varies according to an access frequency. A degree of influence of an access to a cell on each of the other cells in DRAM is referred to as disturbance. When there is a wide gap between cells in a DRAM memory cell array, disturbance is low. However, when the gap between cells is reduced, for example due to scaling, then interference, such as disturbance by an adjacent cell or line, increases.

As for RAM (e.g., DRAM), an access to a particular address cannot be restricted, and therefore, a particular cell may be accessed repeatedly. With the repeated access, the refresh characteristics of the cell rapidly deteriorate due to disturbance.

Therefore, it is beneficial to refresh a cell in which disturbance is concentrated more often in order to improve the refresh characteristics.

SUMMARY

According to some example embodiments of inventive concepts, there is provided a method of operating a memory device including a plurality of memory cells, the plurality of memory cells including a first memory cell and a second memory cell neighboring the first memory cell. The method includes counting a disturbance value of the second memory cell each time the first memory cell is accessed, updating a disturbance count value of the second memory cell based on the counting, adjusting a refresh schedule based on the disturbance count value of the second memory cell, a desired threshold and a maximum disturbance count value, and resetting the disturbance count value of the second memory cell and the maximum disturbance count value when the second memory cell is refreshed according to the adjusted refresh schedule.

The disturbance value may be a cumulative access time of the first memory cell divided by a unit time.

The updating includes adding a disturbance count value stored at a previous access time to a value periodically counted during a current access time of the first memory cell each time the first memory cell is accessed.

The adjusting the refresh schedule may include advancing a refresh operation on the second memory cell in the refresh schedule if the disturbance count value of the second memory cell is at least the desired threshold and is greater than the maximum disturbance count value; and updating the maximum disturbance count value with the disturbance count value of the second memory cell.

The resetting the disturbance count value may include enabling an irregular refresh flag after the memory device is powered up to control the memory device to perform a refresh operation according to the refresh schedule; and disabling the irregular refresh flag if the memory device is in a test mode to stop the refresh operation.

The irregular refresh flag may be reset when the second memory cell is refreshed.

The method may include initializing the disturbance count value when the memory device is powered up.

According to other example embodiments of inventive concepts, there is provided a memory device including a memory cell array including a plurality of memory cells, the plurality of memory cells including a first memory cell and a second memory cell neighboring the first memory cell; control logic configured to read a current disturbance count value of the second memory cell if the first memory cell is accessed, the control logic configured to compare the current disturbance count value with a desired threshold and a maximum disturbance count value, the control logic configured to count a disturbance value of the second memory during a current access time of the first memory cell, and configured to update the disturbance count value based on the counting; and a refresh unit configured to calculate a word line address of the second memory cell, configured to adjust a current refresh schedule for the second memory cell according to a result of the comparison of the disturbance count value, configured to perform a refresh operation on the second memory cell, and configured to control initialization of the refresh operation based on a power up signal.

The memory cell array may include a normal cell array including a plurality of data memory cells configured to store data, the data memory cells including the first and second memory cells, and a disturbance count cell array including a plurality of disturbance count cells configured to store the disturbance count value. At least one of the disturbance count cells may be connected to the same word line as the first memory cell.

The control logic may include an address command decoder configured to receive a clock signal, an active command, and an address from a host, and the address command decoder configured to decode the active command and the address based on the clock signal to generate control signals corresponding to the active command and to generate a row address and a column address for accessing the first memory cell; a count value comparator configured to compare the current disturbance count value with the desired threshold and the maximum disturbance count value; a count value updater configured to update the disturbance count value by adding a disturbance count value stored at a previous access time to a value periodically counted during a current access time of the first memory cell each time the first memory cell is accessed; and a maximum count value storage configured to store a maximum disturbance count value among disturbance count values of the second memory cell from a time of initialization of the memory device to a current operating time and to update the maximum disturbance count value with the updated disturbance count value if the updated disturbance count value is greater than the maximum disturbance count value.

The refresh unit may include an adjacent address calculator configured to calculate an address of the second memory cell based on an address of the first memory cell, which is received from the control logic; a next irregular refresh address and irregular refresh flag storage configured to store the address of the second memory cell as a next irregular refresh address if the current disturbance count value of the second memory cell is at least the desired threshold and is greater than the maximum disturbance count value and configured to store an irregular refresh flag indicating if an irregular refresh operation will be performed on the second memory cell; and a refresh controller configured to adjust the refresh schedule so that the irregular refresh operation on the second memory cell is performed first according to the irregular refresh flag.

The refresh unit may further include a periodic internal refresh command generator configured to entirely refresh the memory cell array based on the power up signal and to output an internal refresh signal for controlling the disturbance count value to be initialized. The control logic may include a count valid flag unit configured to enable a count valid flag according to the internal refresh signal to reset the count value updater, the count value comparator, and the maximum count value storage.

The count value updater may be configured to reset the disturbance count value of the second memory cell after an irregular refresh operation is performed on the second memory cell.

The refresh controller may be configured to insert the irregular refresh operation on the second memory cell into the refresh schedule so that the irregular refresh operation on the second memory cell is performed by priority if the current disturbance count value of the second memory cell is at least the desired threshold and is greater than the maximum disturbance count value.

The refresh controller may be configured to adjust the refresh schedule so that the irregular refresh operation on the second memory cell is performed to keep pace with the refresh schedule if the current disturbance count value of the second memory cell is at least the desired threshold and is greater than the maximum disturbance count value.

The count valid flag unit may be configured to disable the count valid flag when the memory device is in a test mode so that the irregular refresh operation on the second memory cell is not performed.

The memory device may further include a count write/read block configured to read the current disturbance count value of the second memory cell from the disturbance count cell and configured to write the updated disturbance count value to the disturbance count cell.

According to further example embodiments of inventive concepts, there is provided a method of operating a memory system including a plurality of memory cells, the plurality of memory cells including at least one first memory cell and a second memory cell neighboring a word line of the at least one first memory cell. The method includes counting a disturbance value of the second memory cell each time the at least one first memory cell is accessed; updating a disturbance count value of the second memory cell based on the counting; adjusting a sequence of a refresh operation on the second memory cell based on the updated disturbance count value, a maximum disturbance count value and a desired threshold; and resetting the disturbance count value of the second memory cell when the refresh operation on the second memory cell is performed according to the sequence. The disturbance value may be obtained by periodically increasing a counter during a cumulative access time of the first memory cell.

The adjusting the sequence may include scheduling the refresh operation on the second memory cell to come first if the disturbance count value of the second memory cell is at least the desired threshold and is greater than the maximum disturbance count value; updating the maximum disturbance count value with the disturbance count value of the second memory cell; and updating an irregular refresh flag indicating whether to perform a refresh operation on the second memory cell. If the irregular refresh flag is enabled, the method may include performing a refresh operation on the second memory cell; and resetting the irregular refresh flag after resetting the maximum disturbance count value of the second memory cell and the disturbance count value of the second memory cell.

The method may further include resetting all disturbance count values by enabling all word lines in the memory system when the memory system is powered up.

According to other example embodiments of inventive concepts, there is provided a method of operating a memory device comprising a plurality of memory cells, the plurality of memory cells including at least one target memory cell and remaining memory cells. The method includes counting a disturbance count value for each of the remaining memory cells while the at least one target memory cell is accessed, changing a sequence of a refresh operation on each of the remaining memory cell based on the disturbance count value, and resetting the disturbance count value of a memory cell on which the refresh operation has been performed according to the sequence. The counting the disturbance count value may include accumulating a value resulting from counting an access time of the target memory cell since a previous refresh operation on the remaining memory cell.

The changing the sequence of the refresh operation may include, if one of the disturbance count values is equal to a desired threshold and is greater than a maximum disturbance count value, scheduling a refresh operation on a memory cell corresponding to the disturbance count value to be performed by priority; updating the maximum disturbance count value with the disturbance count value; and updating an irregular refresh flag for the memory cell.

The resetting the disturbance count value may include performing the refresh operation on the memory cell when the irregular refresh flag is enabled according to the scheduling; and disabling the irregular refresh flag for the memory cell after resetting the maximum disturbance count value and the disturbance count value of the memory cell.

According to further example embodiments of inventive concepts, there is provided a method of operating a memory device including a plurality of memory cells, the method including calculating a temporary disturbance value of a memory cell neighboring a word line of one or more memory cells, the temporary disturbance value indicating a disturbance value of the memory cell due to an access of the one or more memory cells; updating a permanent disturbance value of the memory cell by adding the temporary disturbance value to the permanent disturbance value each time the one or more memory cells are accessed; and flagging the memory cell as needing to be refreshed if the permanent disturbance value is above a threshold.

The temporary disturbance value may be a cumulative access time of the first memory cell divided by a unit time.

The flagging the memory cell may include flagging the memory cell as needing to be refreshed if the permanent disturbance value is above a maximum disturbance value; and updating the maximum disturbance value with the permanent disturbance value.

The method may include performing a refresh operation on the memory cell if the memory cell is flagged; resetting the permanent disturbance value of the memory cell after performing the refresh operation on the memory cell; and resetting the maximum disturbance value after performing the refresh operation on the memory cell if the maximum disturbance value was updated with the permanent disturbance value.

The method may include adjusting a refresh schedule for the plurality of memory cells to perform the refresh operation on the memory cell prior to performing a regular refresh operation if the memory cell is flagged.

BRIEF DESCRIPTION OF THE DRAWINGS

The above and other features and advantages of example embodiments of inventive concepts will become more apparent by describing in detail example embodiments thereof with reference to the attached drawings in which:

FIGS. 9A and 9B are tables for explaining an operation of refreshing a memory cell according to further example embodiments of inventive concepts;

FIGS. 10A and 8B are tables for explaining an operation of refreshing a memory cell according to other example embodiments of inventive concepts;

FIGS. 11A through 11C are tables for explaining an operation of refreshing a memory cell according to other example embodiments of inventive concepts;

DETAILED DESCRIPTION OF EXAMPLE EMBODIMENTS

Figure 1:
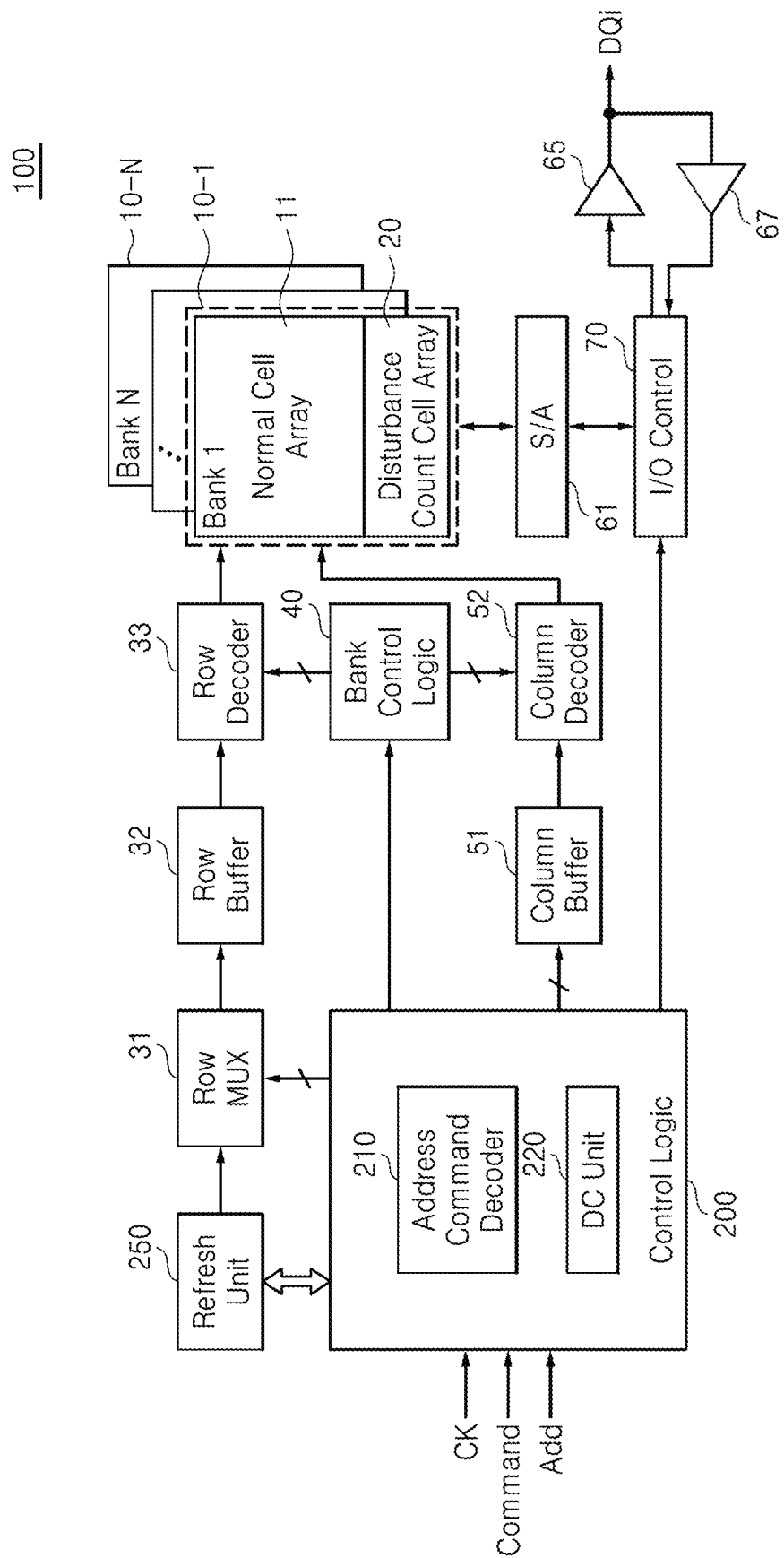
FIG. 1 is a schematic block diagram of a memory device according to some example embodiments of inventive concepts.

Example embodiments of inventive concepts will now be described more fully hereinafter with reference to the accompanying drawings, in which some example embodiments are shown. This invention may, however, be embodied in many different forms and should not be construed as limited to the example embodiments set forth herein. Rather, these example embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular example embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In order to prevent data loss due to leakage current, dynamic random access memory (DRAM) requires a refresh operation of reading data from a cell and rewriting the data to the cell before the data stored in the cell is completely lost. The refresh characteristics of a memory cell is decided not only by the characteristics of the cell itself but is also influenced by dynamic noise of voltages applied to the cell, potential of adjacent cells, or potential of adjacent lines.

Terms "regular refresh operation" and "irregular refresh operation" are used hereinafter to explain specific example embodiments of inventive concepts, but they will not be construed as restricting example embodiments of inventive concepts. It is assumed that a regular refresh operation means that a memory device refreshes a normal cell by itself or according to a control command of an external system regardless of disturbance and an irregular refresh operation means that a refresh schedule is adjusted taking into account a disturbance value of a memory cell so that a refresh operation on a memory cell having a high disturbance value is performed prior to or to keep pace with a regular refresh operation.

Figure 2:
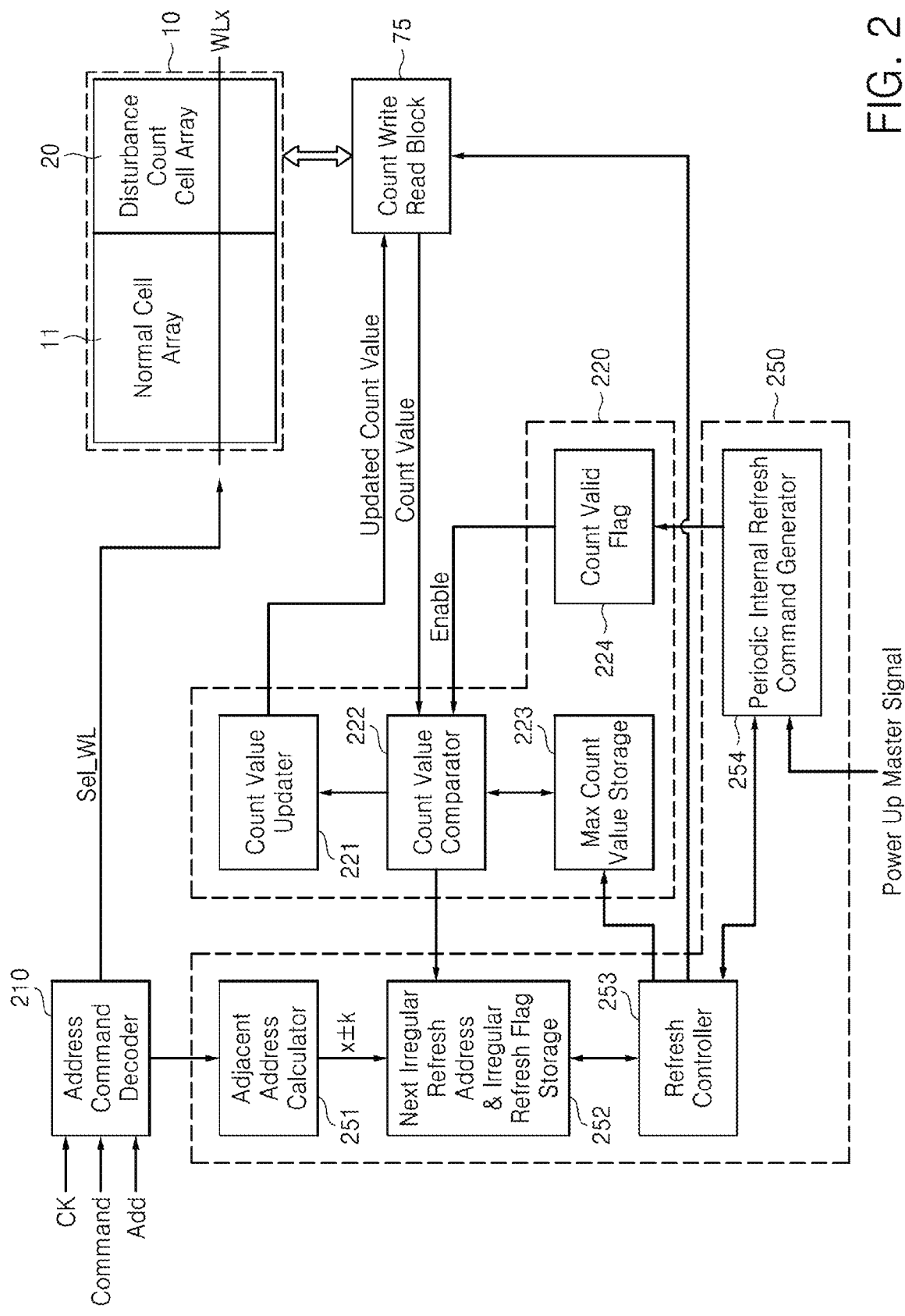
FIG. 2 is a detailed block diagram of a part of the memory device illustrated in FIG. 1.

FIG. 1 is a schematic block diagram of a memory device 100 according to some example embodiments of inventive concepts. FIG. 2 is a detailed block diagram of a part of the memory device 100 illustrated in FIG. 1.

The memory device 100 includes a plurality of cell arrays 10, at least one row multiplexer (MUX) 31, at least one row buffer 32, at least one row decoder 33, a bank control logic 40, at least one column buffer 51, at least one column decoder 52, a sense amplifier (S/A) 61, an output driver 65, an input buffer 67, an input/output (I/O) control unit 70, a control logic 200, and a refresh unit 250.

Each of the cell arrays 10 includes a normal cell array 11 and a disturbance count cell array 20. The normal cell array 11 includes a plurality of normal cells for storing data. The disturbance count cell array 20 includes cells for storing a count value of disturbance given to a victim cell adjacent to or neighboring an aggressor cell, on which memory access is focused among the normal cells. The disturbance count cell array 20 also includes cells for storing a count value of disturbance given to each of other cells connected to a word line ($WL_k$) to which the victim cell (x=k) adjacent to or neighboring the aggressor cell is connected. The cell arrays 10 may be implemented by DRAM but example embodiments of inventive concepts are not restricted by the type of memory.

The control logic 200 controls the elements 250, 31, 40, 51, and 70 in response to a plurality of signals CK, Command, and Add. The clock signal CK may be output by a clock driver (not shown). A plurality of command/address signals Command and Add may be output by a memory controller (not shown) connected to the memory device 100.

The control logic 200 includes an address command decoder 210 and a disturbance count (DC) unit 220. The address command decoder 210 decodes the signals CK, Command, and Add and generates a command and/or an address (e.g., Sel_WL) for controlling each of the elements 250, 31, 40, 51, and 70 according to a decoding result.

For example, the address command decoder 210 may output an active command and a read command to read data from the cell array 10. The address command decoder 210 may also output an address Add of a cell that has stored the data. The address command decoder 210 may also output a refresh command to retain data in a particular cell together with an address Add of a cell to be refreshed.

The bank control logic 40 schedules a refresh operation according to a command output from the control logic 200. Each of banks 10-1 through 10-N (N is a natural number) may perform a refresh operation according to the schedule. The bank control logic 40 selects each of the banks 10-1 through 10-N. The number of banks 10-1 through 10-N including the cell arrays 10 may vary according to example embodiments of inventive concepts.

The DC unit 220 calculates a disturbance value given to a second memory cell (or a victim cell) adjacent to or neighboring a first memory cell (or an aggressor cell) on which memory access is focused. The DC unit 220 will be described in detail with reference to FIG. 2 later.

The refresh unit 250 generates a row address in response to a command output from the control logic 200 to execute a refresh command. For example, the bank control logic 40 counts rows in one of the banks 10-1 through 10-N in response to a memory cell or bank refresh command before a current refresh target bank is switched to another one. The refresh unit 250 will also be described in detail with reference to FIG. 2 later.

The row MUX 31 selects either a row address (or a word line address) generated by the refresh unit 250 or a row address output from the control logic 200 in response to a selection signal (not shown). When a refresh operation is performed, the row MUX 31 selects the row address output from the refresh unit 250. When a write or read operation is performed, the row MUX 31 selects the row address output from the control logic 200.

The at least one row buffer 32 temporarily stores the row address output from the row MUX 31. The at least one row decoder 33 operates corresponding to a bank switched by the bank control logic 40. The row decoder 33 decodes the row address output from the corresponding row buffer 32 and selects one of a plurality of rows (or word lines) according to a decoding result.

Each of the banks 10-1 through 10-N includes a plurality of cell arrays labeled as Bank1 through BankN and at least one S/A 61.

Each of the cell arrays 10 includes a plurality of word lines (or rows), a plurality of bit lines (or columns), the normal cell array 11 for storing data, and the disturbance count cell array 20 for storing disturbance count values. The S/A 61 senses and amplifies a voltage variance in each of the bit lines according to whether data is stored in a cell.

The at least one column buffer 51 temporarily stores a column address output from the control logic 200. The at least one column decoder 52 operates corresponding to a bank switched by the bank control logic 40. The column decoder 52 decodes the column address output from the corresponding column buffer 51 and selects one of a plurality of columns (or bit lines) according to a decoding result.

The I/O control unit 70 transmits a plurality of signals, which have been sensed and amplified by the S/A 61, as data to the output driver 65 or the input buffer 67 according to a control signal output from the control logic 200. During a write operation, the I/O control unit 70 transmits data DQi (where "i" is a natural number) from the input buffer 67 to the normal cell array 11 through a driver (not shown) according to a control signal output from the control logic 200. During a read operation, the I/O control unit 70 transmits a plurality of signals, which have been sensed and amplified by the S/A 61, as data to the output driver 65 according to a control signal output from the control logic 200. The output driver 65 outputs the data to a memory controller (not shown).

The I/O control unit 70 may include a count write/read block 75. The count write/read block 75 accesses the disturbance count cell array 20 to read a current count value from a disturbance count cell and writes an updated count value to the disturbance count cell.

Referring to FIG. 2, the DC unit 220 includes a count value updater 221, a count value comparator 222, a maximum count value storage 223, and a count valid flag unit 224. The count value updater 221 updates a count value by adding a current count value to a count value converted into a minimum refresh time/number of cycles (tRC) during an active period (while a first memory cell is accessed). For example, a count value may be updated by adding a count value stored in a previous access to a value resulting from periodical counting in a current access to the first memory cell.

The count value comparator 222 compares a current count value for an adjacent or a neighboring cell, which is received from the disturbance count cell array 20, with a desired threshold or a maximum count value. The desired threshold is set in the count value comparator 222 and the maximum count value is received from the maximum count value storage 223. The count value comparator 222 sends a comparison result to a next irregular refresh address and irregular refresh flag storage 252.

For example, when a current count value is equal to or greater than the desired threshold and is greater than the maximum count value, a current second memory cell is set to be a target of a next irregular refresh operation. When the second memory cell is set as the target of the next irregular refresh operation, the count value comparator 222 informs the next irregular refresh address and irregular refresh flag storage 252 of this fact. However, when the current count value is less than the desired threshold or is equal to or less than the maximum count value, the second memory cell is not set as the object of the next irregular refresh operation.

The maximum count value storage 223 stores a maximum value among disturbance count values for the second memory cell from a time of the initialization of the memory device 100 to a current time. For example, when a current count value for the second memory cell, which is output from the disturbance count cell array 20 through the count write/read block 75, is greater than a current maximum count value that has been stored, the maximum count value storage 223 stores the current count value as a new maximum count value, thereby updating the maximum count value.

The count valid flag unit 224 controls a disturbance counting operation according to a count valid flag that is enabled or disabled. The count valid flag is disabled when a count value is nondeterminable, for example, when the count value is invalid. In addition, when the memory device 100 measures a dynamic refresh characteristic of a memory cell in a test mode or the like, the count valid flag unit 224 disables the count valid flag, thereby controlling a disturbance counting operation or an irregular refresh operation. In other words, when all disturbance count values are reset in the DC unit 220, the count valid flag unit 224 enables the count valid flag to activate the counting function of the DC unit 220.

When the memory device 100 is powered up, count values may not be valid. Accordingly, the memory device 100 needs to be initialized. During initialization, each of word lines WL of the disturbance count cell array 20 needs to be enabled to be updated with a reset value. Initialization time may be different depending on the characteristic of the memory device 100. The disturbance count cell array 20 may be reset by enabling the word lines WL and writing the same data to the cells as if testing a memory device.

For example, when a periodic internal refresh command generator 254 is enabled in response to a power up master signal, the periodic internal refresh command generator 254 sends a control signal to the count valid flag unit 224. The count valid flag unit 224 is disabled in response to the control signal, stopping the counting function. In other words, values stored in the elements 221, 222, and 223 are reset. When the periodic internal refresh command generator 254 is disabled, the count valid flag unit 224 sends a count valid flag Enable to the count value comparator 222, thereby activating the counting function.

The refresh unit 250 illustrated in FIG. 2 controls the refresh operation of the elements 220 and 75 within the memory device 100. The refresh unit 250 includes an adjacent address calculator 251, the next irregular refresh address and irregular refresh flag storage 252, a refresh controller 253, and the periodic internal refresh command generator 254.

The adjacent address calculator 251 calculates an address WL(x±k) (where "k" is a natural number) of second memory cells of a word line adjacent to or neighboring a current cell, i.e., a first memory cell WLx based on an address of the first memory cell, which is received from the address command decoder 210.

The next irregular refresh address and irregular refresh flag storage 252 stores a irregular refresh flag and an address of a cell that will be subjected to a next refresh operation. The irregular refresh flag indicates whether the next irregular refresh operation will be performed. In other words, when a current count value for a second memory cell is at least the desired threshold and is greater than the maximum count value, the address of the second memory cell is stored as a next irregular refresh address and whether to perform a refresh operation on the second memory cell is indicated by the irregular refresh flag.

The refresh controller 253 combines a regular refresh operation and an irregular refresh operation to control overall refresh operation of the memory device 100. For example, the refresh controller 253 may schedule refresh operations according to the irregular refresh flag. The refresh controller 253 may insert an irregular refresh operation in a current schedule so that the irregular refresh operation is performed prior to or to keep pace with a current refresh operation. The refresh controller 253 may reset a refresh schedule according to the control of the periodic internal refresh command generator 254.

The periodic internal refresh command generator 254 refreshes all word line addresses (or the entire normal memory cell array 11) within the memory device 100 based on the power up master signal and initializes disturbance count values. For example, the periodic internal refresh command generator 254 sends an internal refresh signal to the count valid flag unit 224 in response to the power up master signal.

The count valid flag unit 224 controls the count values that have been stored in the elements 221, 222, and 223 to be reset in response to the internal refresh signal. At this time, the power up master signal may be received from an external system (not shown) or a memory controller (not shown).

Figure 3:
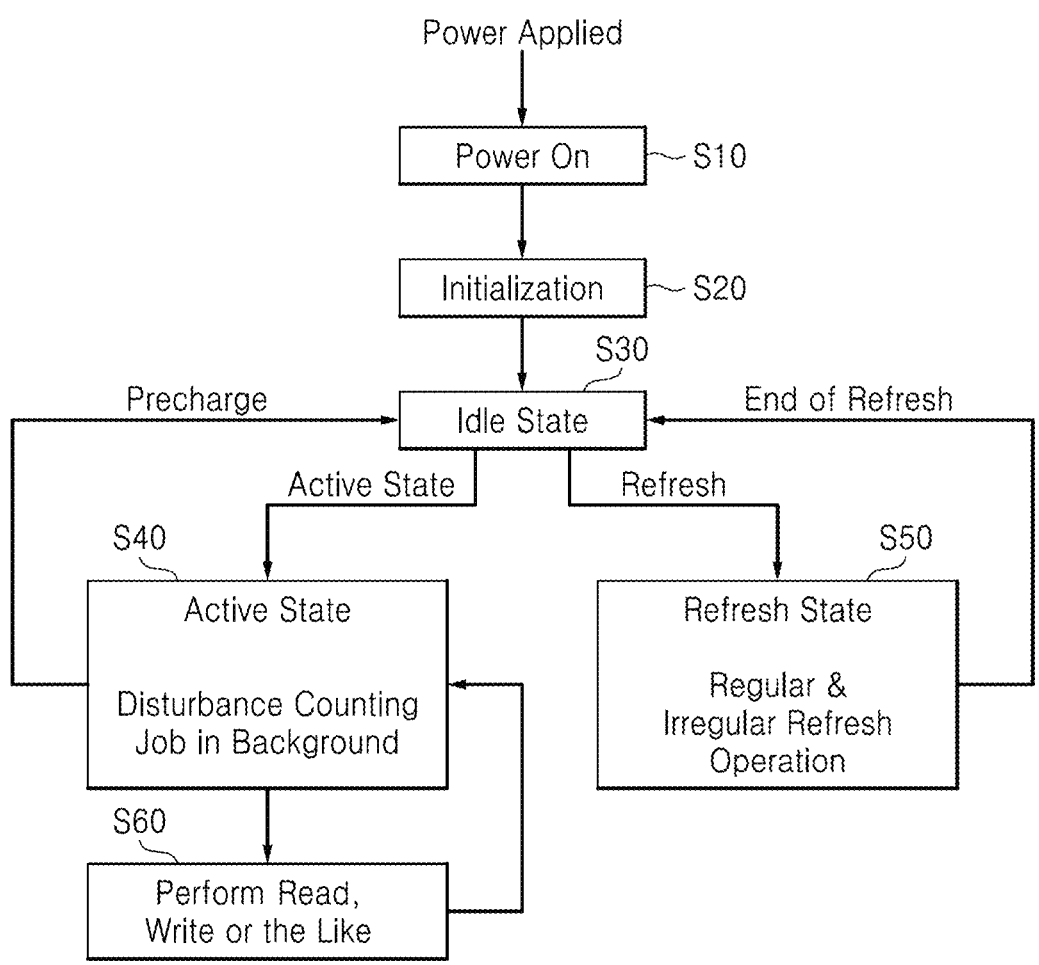
FIG. 3 is a flowchart of an operating method of a memory device according to some example embodiments of inventive concepts.

FIG. 3 is a flowchart of an operating method of the memory device 100 according to some example embodiments of inventive concepts. Referring to FIG. 3, when power is supplied to the memory device 100, power is on in operation S10 and the memory device 100 enables all word lines, thereby initializing all disturbance count values in a disturbance count cell array 20 in operation S20. For example, the memory device 100 may enable all word lines connected with memory cells and reset the memory cells to the same data value for the initialization.

After the initialization in operation S20, the memory device 100 enters an idle state in operation S30. The memory device 100 changes from the idle state to an active state in which the memory device 100 operates according to a command of a host (not shown) in operation S40 or to a refresh state in which the memory device 100 internally refreshes memory cells for data reliability in operation S50.

In the active state, while a target memory cell is being accessed, the memory device 100 counts a disturbance value for each of the remaining memory cells in operation S40. Thereafter, the memory device 100 performs a read operation, a write operation, an erase operation, or the like according to a command of the host in operation S60 and repeats the counting of a disturbance value in operation S40. After completing the operation according to the command, the memory device 100 precharges the target memory cell and enters the idle state in operation S30.

In the refresh state, the memory device 100 refreshes all memory cells except for the target memory cell in operation S50. At this time, the refresh includes a regular refresh operation and an irregular refresh operation. The memory device 100 may perform a regular refresh operation on the memory cells according to a schedule set by a desired (or, alternatively predetermined) rule. Meanwhile, the memory device 100 may consider the disturbance value of each of the memory cells to perform an irregular refresh operation on a memory cell having a maximum disturbance value prior to or to keep pace with the schedule in operation S50. After completing the refresh, the memory device 100 reenters the idle state.

Figure 4:
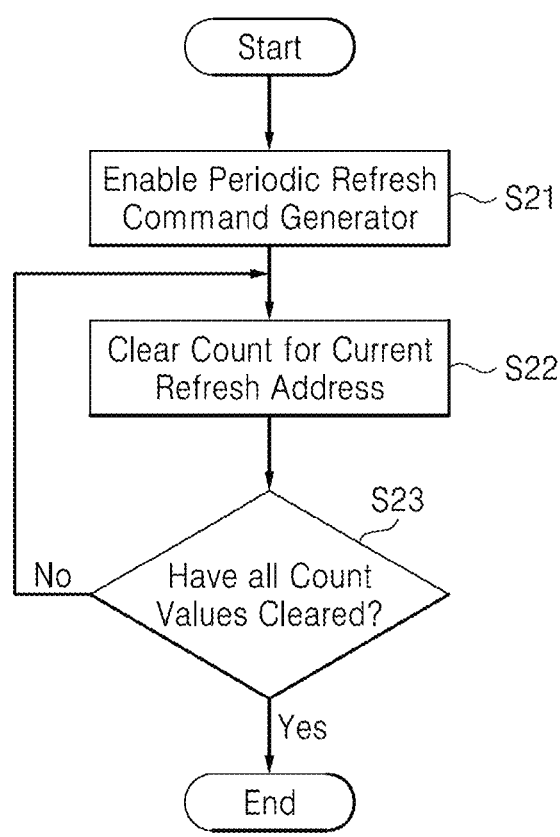
FIG. 4 is a flowchart of initialization in the method illustrated in FIG. 3.

FIG. 4 is a flowchart of initialization operation S20 in the method illustrated in FIG. 3. Referring to FIGS. 3 and 4, when the memory device 100 is powered on in operation S10, the periodic internal refresh command generator 254 is enabled in operation S21. Power-on is detected from a power up master signal. When the periodic internal refresh command generator 254 is enabled, the refresh controller 253 controls a disturbance count value corresponding to a current refresh address to be reset or cleared in operation S22. The periodic internal refresh command generator 254 disables a count valid flag to deactivate a counting function of the DC unit 220. The clearing the count value and the deactivating the counting function are repeated until disturbance count values of all memory cells are reset in operation S23.

Figure 5:
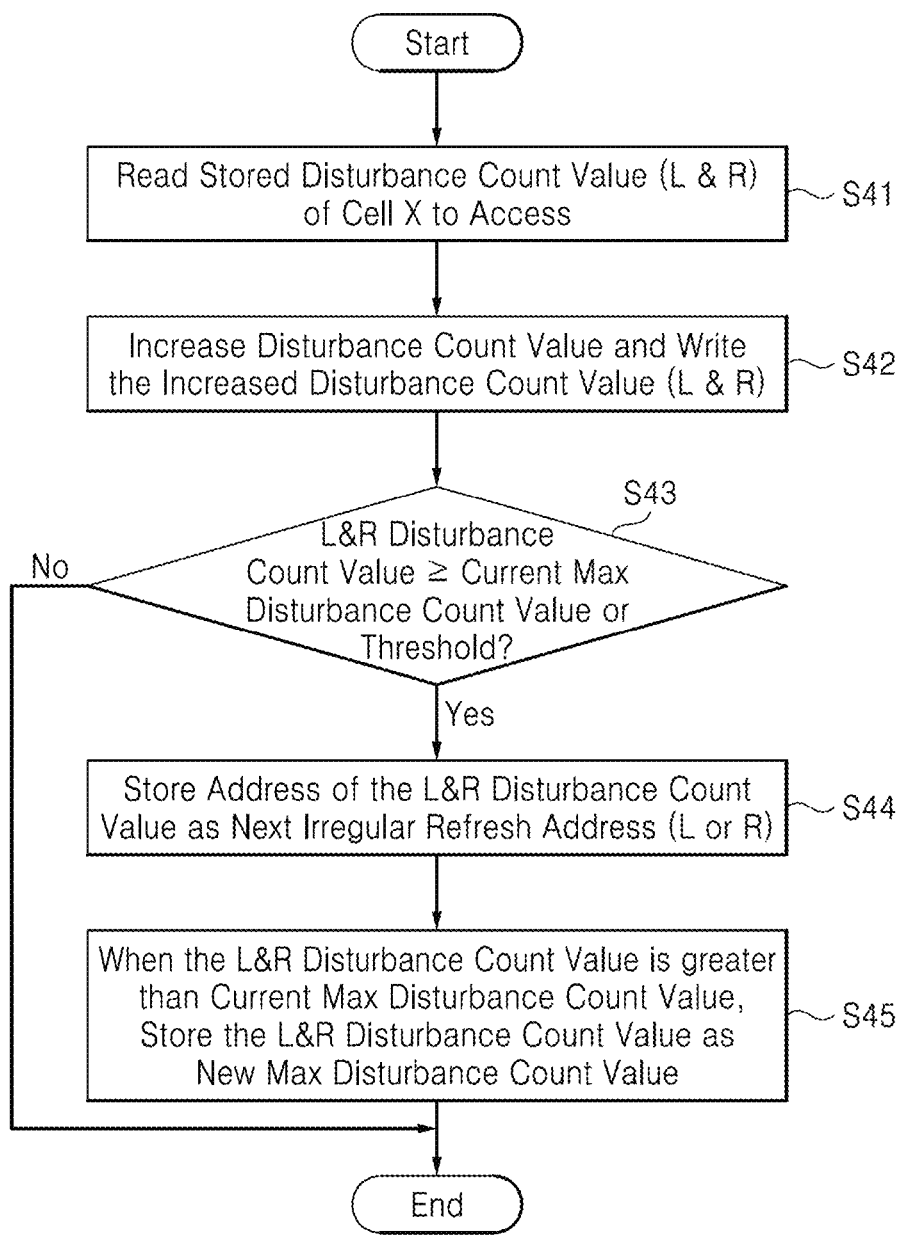
FIG. 5 is a flowchart of operations in an active state in the method illustrated in FIG. 3.

FIG. 5 is a flowchart of operation S40 in the active state in the method illustrated in FIG. 3. Referring to FIG. 5, when the address command decoder 210 receives an active command, the memory device 100 enables a word line of a target address (referred to as a target memory cell) corresponding to the active command in the normal cell array 11 and reads a disturbance count value from a disturbance count cell connected to the word line of the target memory cell in operation S41. The disturbance count value indicates the disturbance value of all memory cells except for the target memory cell, such as cells adjacent to (or neighboring) the target memory cell.

The disturbance value may be expressed by an access time of a word line WLx of the target memory cell "x" divided by a unit time, such as a minimum enable cycle (i.e., minimum tRC or minimum tRAS). For example, a disturbance count value "Disturb Count(x)" may be divided into disturbance count values "Disturb Count(x−k)" and "Disturb Count(x+k)" of adjacent or neighboring cells (i.e., at least one cell positioned in a word line on the left or right of the target memory cell "x" and hereinafter, referred to as remaining memory cells), where "k" is a natural number. When the remaining memory cells (x−k or x+k) are refreshed, the disturbance count value of the remaining memory cells is reset to 0 (or is cleared) after a refresh operation.

Since the memory device 100 accesses the target memory cell "x", the remaining memory cells "x−k" and "x+k" are cumulatively disturbed. Therefore, unless initialized, the disturbance value is counted and the counted value is added to a disturbance count value, which has been stored in the disturbance count cell connected to the word line WLx connected with the target memory cell "x", so that the disturbance count value is updated. The updated disturbance count value is written to and stored in the disturbance count cell in operation S42. In other words, the disturbance value may be a cumulative access time divided by a unit time.

The updated disturbance count value is compared with a desired (or, alternatively predetermined) value and whether to perform a refresh operation is determined according to a comparison result in operation S43. When the updated disturbance count value is greater than a current maximum disturbance count value stored in a previous stage or a desired (or, alternatively predetermined) threshold, an address of the remaining memory cells corresponding to the updated disturbance count value is stored as a next irregular refresh address in operation S44. If the updated disturbance count value is greater than a current maximum disturbance count value stored in a previous stage, the updated disturbance count value is stored as a new maximum disturbance count value in operation S45. On the contrary, when the updated disturbance count value is less than the current maximum disturbance count value stored in the previous stage and the desired (or, alternatively predetermined) threshold, the memory device 100 does not perform a refresh operation and does not store a next irregular refresh address and a new maximum disturbance count value in operation S43.

When executing the active command, the memory device 100 can access only the word line WLx connected with the target memory cell "x" corresponding to the active command, and therefore, the disturbance count value of the adjacent or neighboring cells (i.e., remaining memory cells) x±k is stored in a disturbance count cell connected with the word line WLx in the disturbance count cell array 20.

For example, when the target memory cell "x" on each of both sides (i.e., the left and right sides) of one remaining memory cell x+k or x−k is multi-accessed, that is, when word lines of at least two respective target memory cells are repeatedly accessed, disturbance given to the remaining memory cell is the sum of disturbance values respectively given by both target memory cells. At this time, the disturbance value for the remaining memory cells stored in a disturbance count cell connected to the word line of each target memory cell corresponds to disturbance given by only one target memory cell, and therefore, an accurate disturbance value cannot be obtained, which may lead an error. However, when execution of the active command is continued, the disturbance count value of the target memory cell on each side increases and the remaining memory cell may finally be set as a target cell of an irregular refresh operation. Accordingly, when this fact is considered when the maximum disturbance count value is set, the error can be reduced. This will be described in detail with reference to FIGS. 9A through 11C later.

Figure 6:
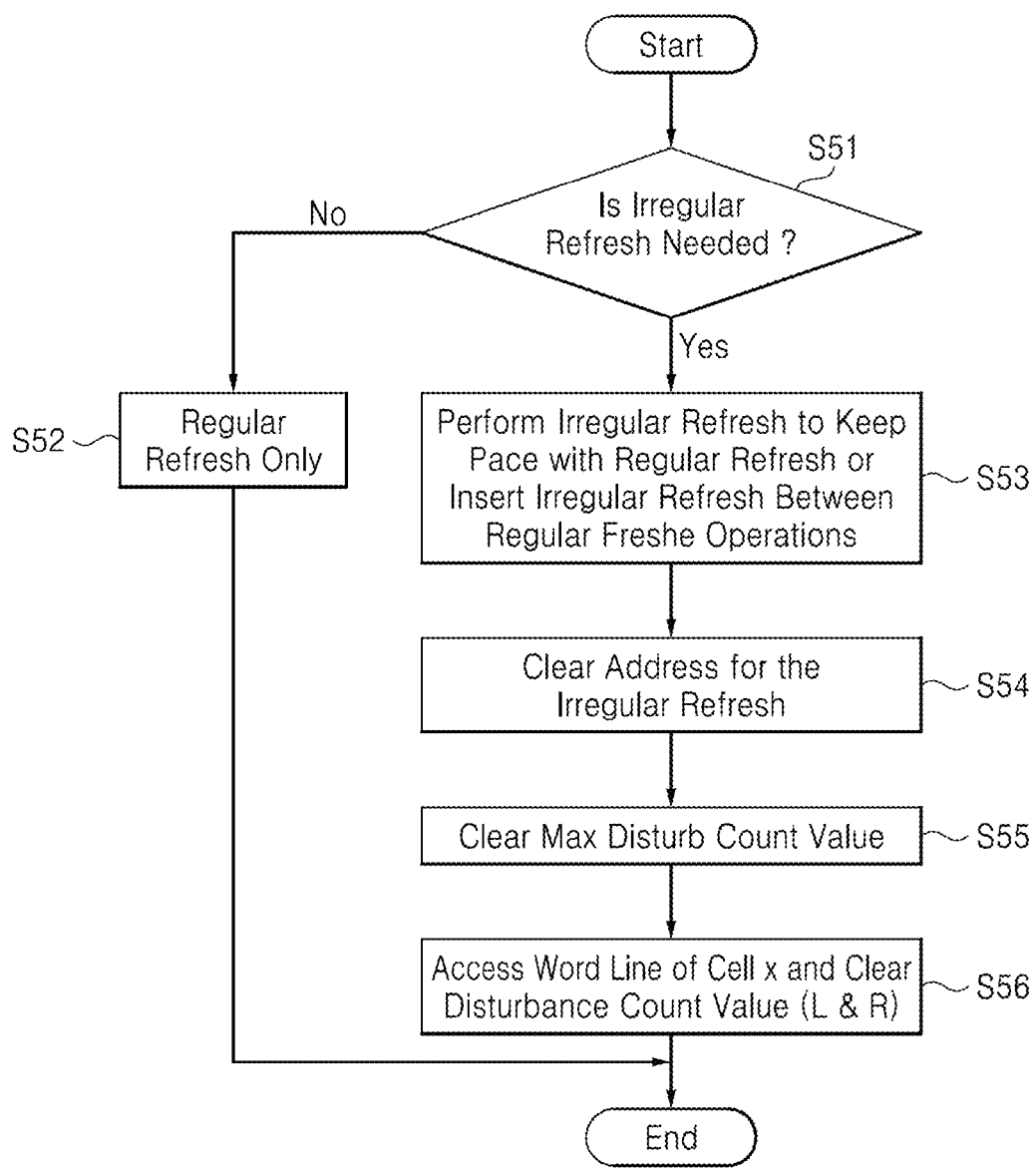
FIG. 6 is a flowchart of operations in a refresh state in the method illustrated in FIG. 3.

FIG. 6 is a flowchart of operation S50 in the refresh state in the method illustrated in FIG. 3. Referring to FIG. 6, when the address command decoder 210 receives a refresh command, the memory device 100 performs a refresh operation. The refresh operation includes a regular refresh operation and an irregular refresh operation. According to the refresh command, the memory device 100 determines whether to perform an irregular refresh operation in operation S51. When the memory device 100 determines not to perform the irregular refresh operation, the memory device 100 disables (i.e., turns off) an irregular refresh flag and performs a refresh operation according to an existing refresh schedule in operation S52.

However, when an irregular refresh operation is necessary, the memory device 100 enables (i.e., turns on) the irregular refresh flag and adjusts the refresh schedule so that the irregular refresh operation on a remaining memory cell is performed to keep pace with the regular refresh operation or is inserted between regular refresh operations in operation S53.

After completing the irregular refresh operation on the remaining memory cell, the memory device 100 clears or resets the address of the remaining memory cell that has been stored for the irregular refresh in operation S54. The memory device 100 also clears or resets the current maximum disturbance count value in operation S55. The memory device 100 accesses the word line of the target memory cell "x" and clears (or resets) the disturbance count value of the remaining memory cell in operation S56.

Accordingly, during a memory cell access operation, the refresh schedule is adjusted so that a memory cell most vulnerable to disturbance, i.e., a memory cell having a highest disturbance value, is first refreshed. As a result, a disturbance value within a refresh interval time of the memory cell is restricted, so that the data reliability of the memory device 100 increases, which increases the performance of the memory device 100.

Figure 7:
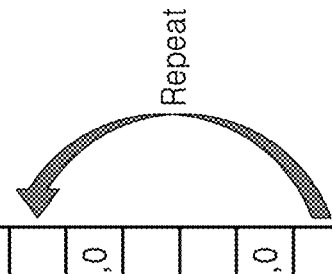
FIG. 7 is a table for explaining an operation of refreshing a memory cell according to some example embodiments of inventive concepts.

FIG. 7 is a table for explaining an operation of refreshing a memory cell according to some example embodiments of inventive concepts. The memory device 100 repeats an access to a target memory cell, i.e., a first memory cell based on an active command and monitors a disturbance value of remaining memory cells, i.e., second memory cells adjacent to or neighboring the first memory cell. The memory device 100 performs an irregular refresh operation on a second memory cell that has a highest disturbance value and thus has a most vulnerable refresh characteristic prior to performing a refresh operation on any other memory cells. Since a maximum disturbance count value in a refresh interval is reset every time the irregular refresh operation is performed, it does not increase continuously and is restricted to a certain level.

Referring to FIG. 7, it is assumed that the memory device 100 repeatedly accesses a first memory cell "x" in ROW=3 and a threshold is 159. Before a first access to the first memory cell "x", i.e., at T=0, the memory device 100 is powered up, and therefore, disturbance count values of second memory cells (ROW 2, ROW 4), which have been stored in the memory device 100, are initialized. In other words, a value (Disturb(x−1), Disturb(x+1)) stored in a disturbance count cell connected to ROW=3 is initialized. For example (ROW 2, ROW 4)=(0, 0).

After the initialization, the memory device 100 accesses the first memory cell "x" in order to perform an operation according to a command of a host. When the first memory cell "x" is repeatedly accessed, i.e., when T=1~159, the memory device 100 cumulatively counts a disturbance value during an access time of the word line (i.e., ROW=3) of the first memory cell "x". For example, a disturbance count value (1, 1) of the second memory cells ROW=2(left) and ROW=4(right) at T=1 increases to a disturbance count value (2, 2) of the second memory cells ROW=2 and ROW=4 at T=2. The disturbance count value of the second memory cells is stored and updated in a disturbance count cell connected to ROW=3 in the disturbance count cell array 20 at each counting.

The gray part, i.e., ROW=3 of the table illustrated in FIG. 7 shows disturbance count values of the second memory cells, which are stored in a disturbance count cell connected to the word line connected with the first memory cell "x" in the disturbance count cell array 20. In other words, since only a first address, i.e., ROW=3 of the first memory cell "x" on which the active command is executed is accessible; disturbance count cells are positioned on the same word line as the first memory cell. A disturbance count value is a result of counting disturbance values of the second memory cells (ROW=2, 4) adjacent to or neighboring the first memory cell "x" during an enable time (or accessed time) of the word line of the first memory cell "x".

When an active command is repeatedly executed on the first memory cell "x", the disturbance count value of each of the second memory cells at two adjacent sides (ROW=2, Left and ROW=4, Right) increases and at least one of the second memory cells finally becomes an object of an irregular refresh.

In determining whether to perform an irregular refresh operation, an irregular refresh operation on a second memory cell connected to a word line ROW=2 is scheduled to be performed first when a current disturbance count value stored in the disturbance count cell is greater than the threshold (=159) at T=160. When it is the turn of the second memory cell to be subjected to the irregular refresh operation according to the refresh schedule, the irregular refresh operation is performed (Refresh 2) and the disturbance count value of the second memory cell is reset (ROW=2, disturbance count value=0).

Thereafter, when the first memory cell (ROW=3) is continuously accessed (T=161~319), the disturbance count value of the second memory cells continuously increases from 0 for ROW=2 and from 160 for ROW=4. Since the cell corresponding to ROW=4 among the second memory cells has not been refreshed while the cell corresponding to ROW=2 has been refreshed, disturbance given to the cell ROW=4 gradually increases.

With the repeated and continuous access to the first memory cell in ROW=3 (T=161~319), the second memory cell in ROW=4 has disturbance greater than a maximum disturbance count value (T=320), and therefore, an irregular refresh operation on the second memory cell in ROW=4 is scheduled to be performed first. According to the refresh schedule, the irregular refresh operation on the second memory cell in ROW=4 is performed (Refresh 4). The word line of the first memory cell "x" is enabled to reset the disturbance count value of the second memory cell in ROW=4, which has been stored in the disturbance count cell.

Thereafter, every time the first memory cell "x" in ROW=3 is accessed, the disturbance count value of the second memory cells is increased. The memory device 100 performs an irregular refresh operation on the second memory cells based on the disturbance count value compared with the threshold or the maximum disturbance count value.

A maximum disturbance count value MaxDisturb when at least one memory cell in a memory cell array is repeatedly accessed is defined by Equation 1:

$$\text{MaxDisturb}=(2n-1) \times tREFI/tRC/n+(\text{Threshold}+1), \quad (1)$$

wherein "n" is the number of word lines connected with repeatedly accessed cells.

A disturbance value is a total enable time of a word line. To make the disturbance value into an integer, an enable time is accumulated and then divided by a unit time (i.e., a word line access time in case of tRASmin or tRCmin) For example, when a first memory is repeatedly accessed at a tREF of 64 ms and a refresh cycle time of 8K and an access time tRCmin of a word line connected with the first memory cell is 50 ns, tREFI is 8 μs, and therefore, the maximum disturbance MaxDisturb during tREFI is 8 μs/50 ns=160 according to Equation 1.

Figure 8A:
FIGS. 8A and 8B are tables for explaining an operation of refreshing a memory cell according to other example embodiments of inventive concepts.
Figure 8B:
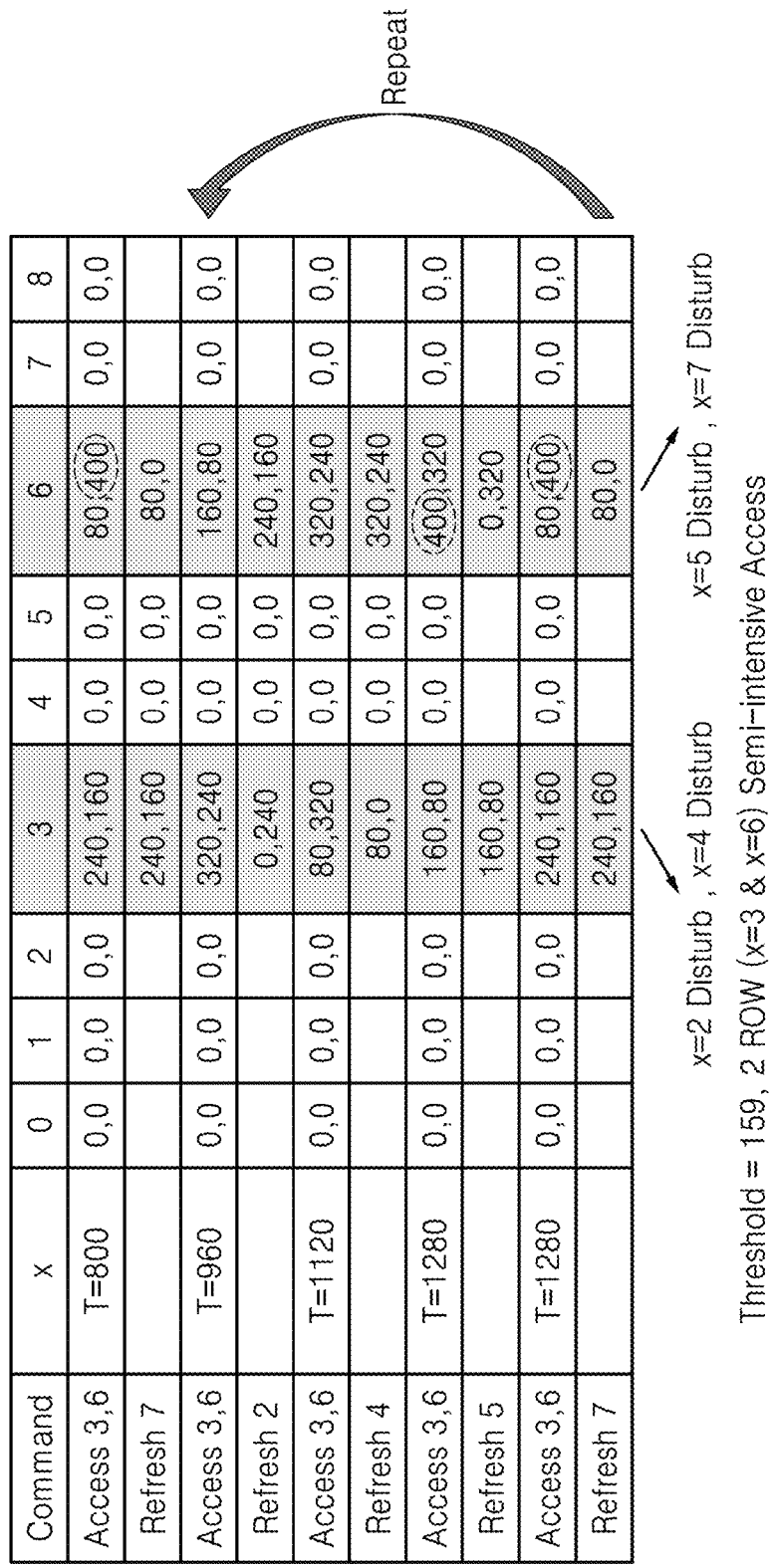

FIGS. 8A and 8B are tables for explaining an operation of refreshing a memory cell according to other example embodiments of inventive concepts. While one word line is repeatedly accessed in the example embodiments illustrated in FIG. 7, two word lines are repeatedly accessed in the example embodiments illustrated in FIGS. 8A and 8B.

It is assumed that the memory device 100 repeatedly accesses first memory cells in at least two respective word lines, e.g., ROW=3 and ROW=6, and a threshold is 159.

Referring to FIG. 8A, the memory device 100 is powered up before a first access (T=0), and therefore, disturbance count values of second memory cells (ROW=2, ROW=4, ROW=5, ROW=7), which have been stored in the memory device 100, are initialized. In other words, a value (Disturb(x−1), Disturb(x+1)) stored in a disturbance count cell connected to each of ROW=3 and ROW=6 is initialized (i.e., (ROW 2, ROW 4)=(0, 0) and (ROW 5, ROW 7)=(0, 0)).

After the initialization, the memory device 100 accesses the first memory cells (x=3, 6) respectively positioned in ROW=3 and ROW=6. When the first memory cells are repeatedly accessed (T=1159), the memory device 100 counts a disturbance value of each of the second memory cells (ROW=2, 4, 5, 7) every time the first memory cells are accessed.

The disturbance count values (ROW 2, ROW 4) and (ROW 5, ROW 7) of the second memory cells are respectively stored in disturbance count cells of the first memory cells (ROW=3, 6) that are accessed. This is because the memory device 100 enables and accesses only first memory cells corresponding to a first address ROW=3, 6 on which an active command is executed and does not enable word lines corresponding to ROW=2, 4, 5, 7 connected with the second memory cells.

When a current disturbance count value 160 of the second memory cells (ROW=2, 4, 5, 7) read from the disturbance count cells is greater than the threshold of 159 (T=320), the memory device 100 refreshes the second memory cell in ROW=2 (Refresh 2) and resets the disturbance count value of the second memory cell (ROW=2) that has been refreshed (i.e., (ROW 2, ROW 4)=(0, 160) in ROW=3).

Thereafter, when the first memory cells (ROW=3, 6) are continuously accessed (T=321~479), the disturbance count values of the second memory cells continuously increase from 0 for ROW=2 and from 160 for ROW=4, 5, 7. Since the cells corresponding to ROW=4, 5, 7 among the second memory cells have not been refreshed while the cell corresponding to ROW=2 has been refreshed, the disturbance count values for ROW=4, 5, 7 continuously increase.

With the repeated and continuous access to the first memory cells in ROW=3, 6 (T=321~480), the disturbance count value of the second memory cell in ROW=4 reaches a maximum disturbance count value of 240 (T=480), and therefore, the memory device 100 adjusts a refresh schedule so that an irregular refresh operation on the second memory cell in ROW=4 is performed first. According to the refresh schedule, the memory device 100 performs the irregular refresh operation on the second memory cell in ROW=4 (Refresh 4) and resets the disturbance count value for ROW=4 (i.e., (ROW 2, ROW 4)=(80, 0) in ROW=3).

Thereafter, the memory device 100 continuously increases the disturbance count values of the second memory cells every time the first memory cells (ROW=3, 6) are accessed. When the first memory cells (ROW=3, 6) are repeatedly and continuously accessed, a disturbance count value of the second memory cell in ROW=5 influenced by the first memory cell in ROW=6 exceeds the threshold of 159 and maximum disturbance count value of 240 at T=640, as shown in the disturbance count value (ROW 5, ROW 7)=(320, 320). At this time, the memory device 100 performs an irregular refresh operation on the second memory cell in ROW=4 and resets the disturbance count value (ROW 5, ROW 7) to (0, 320).

Similarly, in the example embodiments illustrated in FIG. 8B, the disturbance count value of second memory cells is updated every time a first memory cell is accessed, the schedule of irregular refresh operations is determined according to a result of comparing the disturbance count value with a threshold or a maximum disturbance count value. In other words, the memory device 100 adjusts the schedule of operations so that an irregular refresh operation can be performed even during a regular refresh operation based on the disturbance count value of the second memory cells.

As a result, as compared to the example embodiments illustrated in FIG. 7 in which a single word line is repeatedly accessed, the maximum disturbance count value is greater in the example embodiments illustrated in FIGS. 8A and 8B. However, even considering that the maximum disturbance count value is greater, since the memory device 100 adjusts the refresh schedule based on a current disturbance count value, the maximum disturbance count value is eventually restricted (to 400 in FIG. 8B) even though the first memory cell is repeatedly accessed.

As described above, when the memory device 100 repeatedly accesses at least two memory cells, at least one adjacent/neighboring memory cell of each of the two memory cells is disturbed. At this time, a maximum disturbance count value MaxDisturb is defined by Equation 2:

$$\text{MaxDisturb}=(2n-1)\times tREFI/tRC/n+(\text{Threshold}+1), \quad (2)$$

wherein "n" is the number of word lines connected with repeatedly accessed cells.

A disturbance value is a total enable time of a word line. To make the disturbance value into an integer, an enable time is accumulated and then divided by a unit time (i.e., a word line access time in case of tRASmin or tRCmin). Since Equation 2 is an increasing function, the maximum disturbance count value converges to 480 when "n" is infinite. 480×tRC=24 μs (tRC=50 ns at this time) which is the worst case when at least one of the second memory cells is not concurrently disturbed by first memory cells.

Figure 9B:
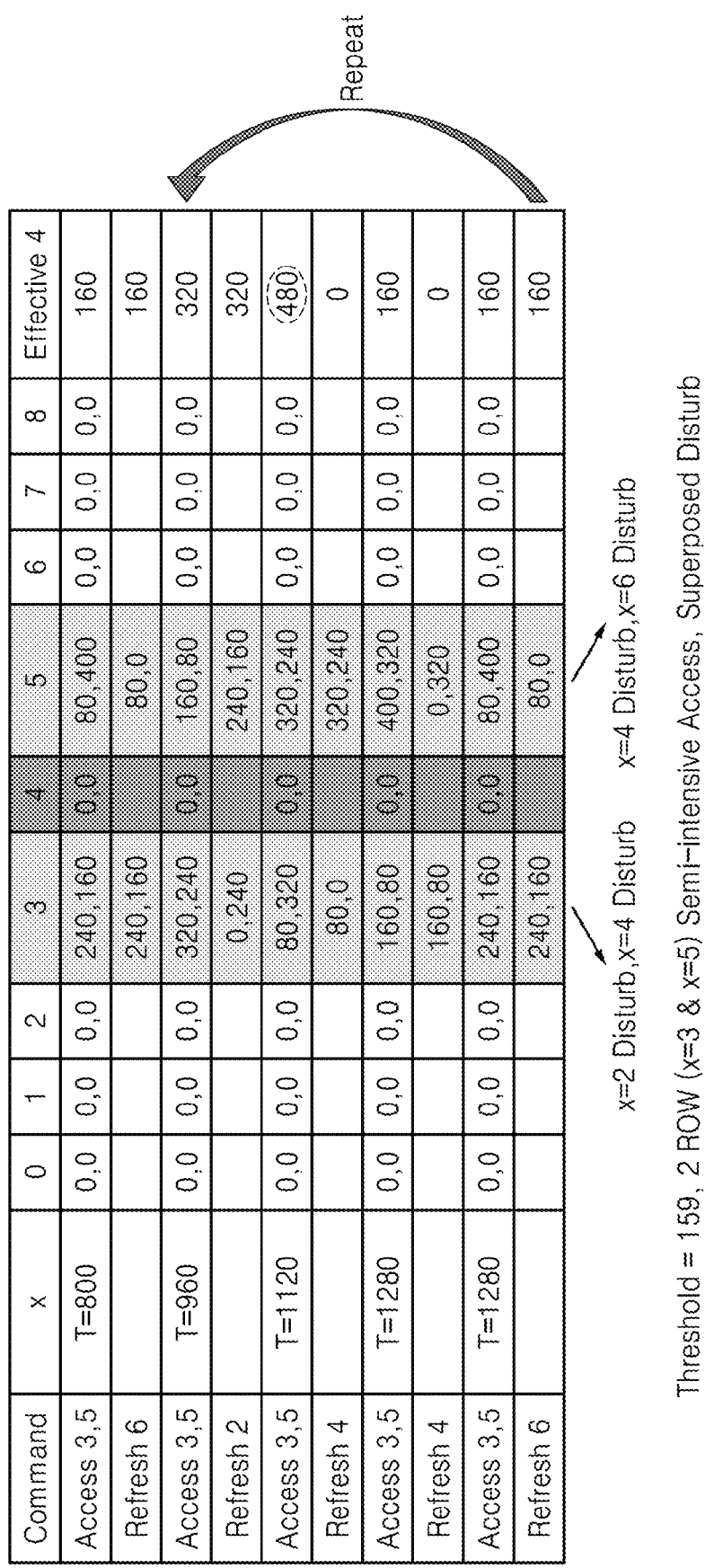

FIGS. 9A and 9B are tables for explaining an operation of refreshing a memory cell according to further example embodiments of inventive concepts. While two word lines that are not adjacent to each other are repeatedly accessed in the example embodiments illustrated in FIGS. 8A and 8B, two adjacent word lines are repeatedly accessed in the example embodiments illustrated in FIGS. 9A and 9B.

It is assumed that the memory device 100 repeatedly accesses first memory cells in at least two respective word lines, e.g., ROW=3 and ROW=5, and a threshold is 159.

Referring to FIG. 9A, the memory device 100 is powered up before a first access (T=0), and therefore, disturbance count values of second memory cells (ROW=2, ROW=4, ROW=6), which have been stored in the memory device 100, are initialized. In other words, a value (Disturb(x−1), Disturb(x+1)) stored in a disturbance count cell connected to each of ROW=3 and ROW=5 is initialized (i.e., (ROW 2, ROW 4)=(0, 0) and (ROW 4, ROW 6)=(0, 0)).

After the initialization, the memory device 100 accesses the first memory cell positioned in ROW=3. When the first memory cells are repeatedly accessed (T=1-159), the memory device 100 counts a disturbance value of each of the second memory cells (ROW=2, 4, 6) each time the first memory cells are accessed. Unlike the example embodiments illustrated in FIG. 7, among the second memory cells connected to word lines neighboring the repeatedly accessed word lines, a second memory cell in ROW=4 is concurrently disturbed by ROW=3 and ROW=5 in the example embodiments illustrated in FIGS. 9A and 9B.

The disturbance count values (ROW 2, ROW 4) and (ROW 4, ROW 6) of the second memory cells are respectively stored in disturbance count cells of the first memory cells (ROW=3, 5) that are accessed. This is because the memory device 100 can access only first memory cells corresponding to a first address ROW=3, 5 on which an active command is executed. At this time, since the second memory cell in ROW=4 is concurrently disturbed, the sum of disturbance count values respectively stored for the second memory cell in ROW=4 in the disturbance count cells of the respective first memory cells (ROW=3, 5) is an actual disturbance value (Effective 4 in FIG. 9A).

When a current disturbance count value (160) read from the disturbance count cells is greater than the threshold of 159 (T=320), the memory device 100 refreshes the second memory cell in ROW=2 (Refresh 2) and resets the disturbance count value of the second memory cell (ROW=2) that has been refreshed (i.e., ROW=2, disturbance count value=0).

Thereafter, when the first memory cells (ROW=3, 5) are continuously accessed (T=321~479), the disturbance count values of the second memory cells continuously increase from 0 for ROW=2 and from 160 for ROW=4, 6. Since the cells corresponding to ROW=4, 6 among the second memory cells have not been refreshed while the cell corresponding to ROW=2 has been refreshed, the disturbance count values for ROW=4, 6 continuously increase.

With the repeated and continuous access to the first memory cells in ROW=3, 5 (T=321~480), the actual disturbance count value of the second memory cell in ROW=4 reaches a maximum disturbance count value of 480 (T=480), and therefore, the memory device 100 adjusts a refresh schedule so that an irregular refresh operation on the second memory cell in ROW=4 is performed first. According to the refresh schedule, the memory device 100 performs the irregular refresh operation on the second memory cell in ROW=4 (Refresh 4) and resets the disturbance count value for ROW=4 (i.e., (ROW 2, ROW 4)=(80, 0) in ROW=3).

Thereafter, the memory device 100 continuously increases the disturbance count values of the second memory cells every time the first memory cells (ROW=3, 5) are accessed. When the first memory cells (ROW=3, 5) are repeatedly and continuously accessed, an actual disturbance count value (Effective 4=160) of the second memory cell in ROW=4 influenced by the first memory cell in ROW=5 exceeds the threshold of 159. At this time, the memory device 100 performs an irregular refresh operation on the second memory cell in ROW=4.

Similarly, in the example embodiments illustrated in FIG. 9B, the disturbance count value of second memory cells is updated every time a first memory cell is accessed, the schedule of irregular refresh operations is determined according to a result of comparing the disturbance count value with a threshold or a maximum disturbance count value. In other words, the memory device 100 adjusts the schedule of operations so that an irregular refresh operation can be performed even during a regular refresh operation based on the disturbance count value of the second memory cells.

As a result, as compared to the example embodiments illustrated in FIG. 7 in which at least one word line is not concurrently accessed, the maximum disturbance count value is greater in the example embodiments illustrated in FIGS. 9A and 9B. However, even considering a second memory cell is concurrently disturbed, since the memory device 100 adjusts the refresh schedule based on a current disturbance count value, the maximum disturbance count value is eventually restricted even when the first memory cell is repeatedly and continuously accessed.

As described above, when the memory device 100 repeatedly accesses at least two memory cells, at least one adjacent/neighboring memory cell is disturbed concurrently. At this time, a maximum disturbance count value MaxDisturb is defined by Equation 3:

$$MaxDisturb=(2n-3) \times tREFI/2tRC/n+(Threshold+1) \times 2 \qquad (3)$$

wherein "n" is the number of word lines connected with repeatedly accessed cells.

FIGS. 10A and 10B are tables for explaining an operation of refreshing a memory cell according to other example embodiments of inventive concepts. While one word line is repeatedly accessed in the example embodiments illustrated in FIG. 7, three word lines are repeatedly accessed in the example embodiments illustrated in FIGS. 10A and 10B.

It is assumed that the memory device 100 repeatedly accesses first memory cells in at least two respective word lines, e.g., ROW=1, ROW=4, and ROW=7, and a threshold is 159.

Referring to FIG. 10A, the memory device 100 is powered up before a first access (T=0), and therefore, disturbance count values of second memory cells (ROW=0, 2, 3, 5, 6, 8), which have been stored in the memory device 100, are initialized. In other words, a value (Disturb(x−1), Disturb(x+1)) stored in a disturbance count cell connected to each of ROW=1, ROW=4, and ROW=7 is initialized (i.e., (ROW 0, ROW 2)=(0, 0), (ROW 3, ROW 5)=(0, 0), and (ROW 6, ROW 8)=(0, 0)).

After the initialization, the memory device 100 accesses the first memory cells (or target memory cells) respectively positioned in ROW=1, ROW 4, and ROW=7. When the first memory cells are repeatedly accessed (T=1480), the memory device 100 counts a disturbance value of each of the second memory cells (ROW=0, 2, 3, 5, 6, 8) each time the first memory cells are accessed. For convenience' sake in the description, it is assumed that each second memory cell is not concurrently disturbed by first memory cells other than a first memory cell connected to a word line closest to the second memory cell. For example, the second memory cell in ROW=2 is not concurrently disturbed by ROW=4 or ROW=7 but is disturbed only by ROW=1.

The disturbance count values (ROW 0, ROW 2), (ROW 3, ROW 5), and (ROW 6, ROW 8) of the second memory cells are respectively stored in disturbance count cells of the first memory cells (ROW=1, 4, 7) that are accessed. This is because the memory device 100 enables and accesses only first memory cells corresponding to a first address ROW=1, 4, 7 on which an active command is executed and does not enable ROW=0, 2, 3, 5, 6, 8 connected with the second memory cells.

When a current disturbance count value (160) of the second memory cells (ROW=0, 2, 3, 5, 6, 8) read from the disturbance count cells is greater than the threshold of 159 (T=480), the memory device 100 refreshes the second memory cell in ROW=0 (Refresh 0) and resets the disturbance count value of the second memory cell (ROW=0) that has been refreshed (i.e., (ROW 0, ROW 2)=(0, 160) in ROW=1).

Thereafter, when the first memory cells (ROW=1, 4, 7) are continuously accessed (T=381~639), the disturbance count values of the second memory cells continuously increase from 0 for ROW=0 and from 160 for ROW=2, 3, 5, 6, 8. Since the cells corresponding to ROW=2, 3, 5, 6, 8 among the second memory cells have not been refreshed while the cell corresponding to ROW=0 has been refreshed, the disturbance count values for ROW=2, 3, 5, 6, 8 continuously increase.

With the repeated and continuous access to the first memory cells in ROW=1, 4, 7 (T=481~640), the disturbance count value of the second memory cell in ROW=2 reaches a maximum disturbance count value of 214 (T=640), and therefore, the memory device 100 adjusts a refresh schedule so that an irregular refresh operation on the second memory cell in ROW=2 is performed first. According to the refresh schedule, the memory device 100 performs the irregular refresh operation on the second memory cell in ROW=2 (Refresh 2) and resets the disturbance count value for ROW=2 (i.e., (ROW 0, ROW 2)=(54, 0) in ROW=1).

Thereafter, referring to FIGS. 10A and 10B, the memory device 100 continuously increases the disturbance count values of the second memory cells every time the first memory cells (ROW=1, 4, 7) are accessed. When the first memory cells (ROW=1, 4, 7) are repeatedly and continuously accessed, disturbance count values of the second memory cells exceed the threshold of 159 or a maximum disturbance count value of 426 at T=800, 960, 1120, 1280. At this time, the memory device 100 performs an irregular refresh operation on the second memory cells (Refresh 3, 5, 6, 8).

Similarly, the disturbance count value of the second memory cells is updated every time each of the first memory cell is accessed, the schedule of irregular refresh operations is determined according to a result of comparing the disturbance count value with a threshold or a maximum disturbance count value. In other words, the memory device 100 adjusts the schedule of operations so that an irregular refresh operation can be performed even during a regular refresh operation based on the disturbance count value of the second memory cells.

As a result, as compared to the example embodiments illustrated in FIG. 7 in which a single word line is repeatedly accessed, the maximum disturbance count value is greater in the example embodiments illustrated in FIGS. 10A and 10B. However, even considering that the maximum disturbance count value is greater, since the memory device 100 adjusts the refresh schedule based on a current disturbance count value, the maximum disturbance count value is eventually restricted (to 426 in FIG. 10B) even though the first memory cell is repeatedly accessed.

As described above, when the memory device 100 repeatedly accesses at least two memory cells, at least one adjacent/neighboring memory cell of each of the two memory cells is disturbed. At this time, a maximum disturbance count value MaxDisturb, which is restricted, is defined by Equation 4

$$\text{MaxDisturb}=(2n-1)\times tREFI/tRC/n+(\text{Threshold}+1), \quad (4)$$

wherein "n" is the number of word lines connected with repeatedly accessed cells.

A disturbance value is a total enable time of a word line. To make the disturbance value into an integer, an enable time is accumulated and then divided by a unit time (i.e., a word line access time in case of tRASmin or tRCmin).

FIGS. 11A through 11C are tables for explaining an operation of refreshing a memory cell according to yet other example embodiments of inventive concepts. While only one word line is repeatedly accessed in the example embodiments illustrated in FIG. 7, four adjacent word lines are repeatedly accessed and memory cells positioned in at least three word lines among remaining memory cells are concurrently disturbed in the example embodiments illustrated in FIGS. 11A through 11C.

It is assumed that the memory device 100 repeatedly accesses first memory cells in four respective word lines, e.g., ROW=1, 3, 5, 7, and a threshold is 159.

Referring to FIG. 11A, the memory device 100 is powered up before a first access (T=0), and therefore, disturbance count values of second memory cells (ROW=0, 2, 4, 6, 8), which have been stored in the memory device 100, are initialized.

After the initialization, the memory device 100 accesses the first memory cells (or target memory cells) positioned in ROW=1, 3, 5, 7. When the first memory cells are repeatedly accessed, the memory device 100 counts a disturbance value of each of the second memory cells (ROW=0, 2, 4, 6, 8) every time each of the first memory cells (ROW=1, 3, 5, 7) is accessed. At this time, ROW=2, 4, 6 is disposed between first memory cells and thus concurrently disturbed from both sides.

The disturbance count values of the second memory cells are respectively stored in disturbance count cells of the first memory cells (ROW=1, 3, 5, 7) that are accessed. Since the disturbance count value of each of the second memory cells in ROW=2, 4, 6 stored one of ROW=1, ROW=3, ROW=5, and ROW=7 corresponds to disturbance by ROW=1, ROW=3, ROW=5; or ROW=7 at only one side of each second memory cell, an actual disturbance given to ROW=2, 4, 6 is the sum of disturbances given by ROW=1, 3, 5, 7 (e.g., at T=640, a disturbance count value of ROW=2 influenced by ROW=1 is 160 and a disturbance count value of ROW=2 influenced by ROW=3 is 160, and therefore, an actual disturbance count value E2 of ROW=2 is 160+160=320).

When a current disturbance count value of any of the second memory cells (ROW=0, 2, 4, 6, 8) read from the disturbance count cells is greater than the threshold of 159, the memory device 100 refreshes the second memory cell in ROW=0 (Refresh 0 at T=640) and resets the disturbance count value of the second memory cell (ROW=0) that has been refreshed.

Referring to FIGS. 11A through 11C, every time accessing the first memory cells (ROW=1, 3, 5, 7), the memory device 100 continuously increases the disturbance count value of the second memory cells and adjusts the schedule of irregular refresh operations based on a result of comparing the disturbance count value with a threshold or a maximum disturbance count value. When the first memory cells (ROW=1, 3, 5, 7) are repeatedly and continuously accessed, the disturbance count values of the second memory cells exceed the threshold of 159 or a maximum disturbance count value of 720 at T=800, 960, 1120, 1280, 1440, 1600, 1760; and the memory device 100 performs an irregular refresh operation on the second memory cells (Refresh 2, 2, 4, 4, 6, 6, 8 at T=800, 960, 1120, 1280, 1440, 1600, 1760, respectively). In other words, concurrently disturbed second memory cells are refreshed concurrently considering disturbance count values from respective word lines at both sides.

As a result, as compared to the example embodiments illustrated in FIG. 7 in which a single word line is repeatedly accessed or the example embodiments illustrated in FIGS. 10A and 10B in which at least two word lines are not concurrently accessed, the maximum disturbance count value is greater in the example embodiments illustrated in FIGS. 11A through 11C. However, even considering that the maximum disturbance count value is greater, since the memory device 100 adjusts the refresh schedule based on a current disturbance count value, the maximum disturbance count value is eventually restricted (to 720 in FIG. 11B and to 560 in a repeated loop) even though the first memory cell is repeatedly accessed.

As described above, when the memory device 100 repeatedly accesses at least two memory cells, at least one adjacent/neighboring memory cell of each of the two memory cells is disturbed. At this time, a maximum disturbance count value MaxDisturb, which is restricted, is defined by Equation 5:

$$\text{MaxDisturb}=(2n-3) \times tREFI/2tRC/n+(\text{Threshold}+1) \times 2 \qquad (5)$$

wherein "n" is the number of word lines connected with repeatedly accessed cells.

A disturbance value is a total enable time of a word line. To make the disturbance value into an integer, an enable time is accumulated and then divided by a unit time (i.e., a word line access time in case of tRASmin or tRCmin). Since Equation 5 is an increasing function in an entire range of "n", the maximum disturbance count value converges to 960 when "n" is infinite. When tRC=50 ns, n*tRC=960*50 ns=48 which is the worst case.

Figure 12:
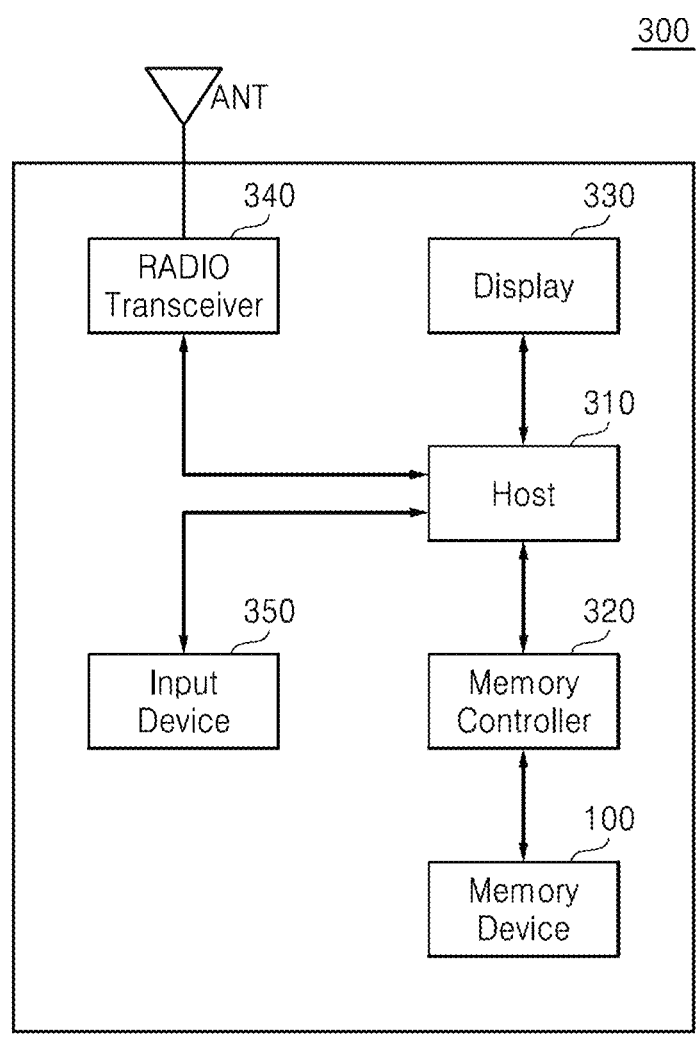
FIG. 12 is a block diagram of a computer system including the memory device illustrated in FIG. 1 according to some example embodiments of inventive concepts.

FIG. 12 is a block diagram of a computer system 300 including the memory device 100 illustrated in FIG. 1 according to some example embodiments of inventive concepts. Referring to FIG. 12, the computer system 300 may be implemented as a cellular phone, a smart phone, a tablet personal computer (PC), a personal digital assistant (PDA) or a radio communication system.

The computer system 300 includes the memory device 100 and a memory controller 320 controlling the operations of the memory device 100. The memory controller 320 may control the data access operations, e.g., a program operation, an erase operation, and a read operation, of the memory device 100 according to the control of a host 310.

The data in the memory device 100 may be displayed through a display 330 according to the control of the host 310 and the memory controller 320.

A radio transceiver 340 transmits or receives radio signals through an antenna ANT. The radio transceiver 340 may convert radio signals received through the antenna ANT into signals that can be processed by the host 310. Accordingly, the host 310 may process the signals output from the radio transceiver 340 and transmit the processed signals to the memory controller 320 or the display 330. The memory controller 320 may program the signals processed by the host 310 to the memory device 100. The radio transceiver 340 may also convert signals output from the host 310 into radio signals and outputs the radio signals to an external device through the antenna ANT.

An input device 350 enables control signals for controlling the operation of the host 310 or data to be processed by the host 310 to be input to the computer system 300. The input device 350 may be implemented by a pointing device such as a touch pad or a computer mouse, a keypad, or a keyboard.

The host 310 may control the operation of the display 330 to display data output from the memory controller 320, data output from the radio transceiver 340, or data output from the input device 350. The memory controller 320, which controls the operations of the memory device 100, may be implemented as a part of the host 310 or as a separate chip.

Figure 13:
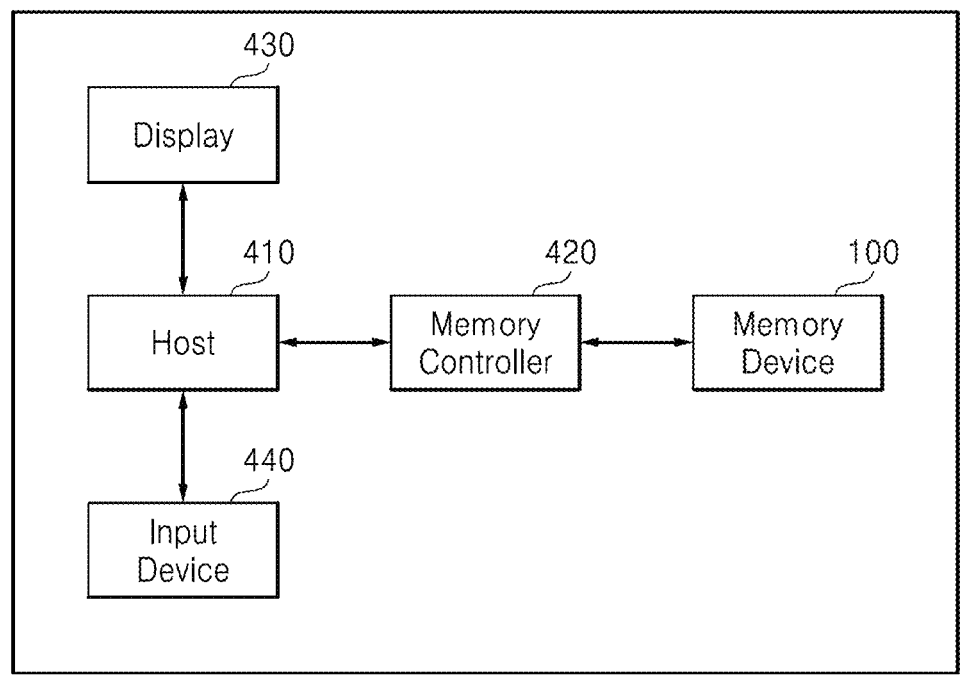
FIG. 13 is a block diagram of a computer system including the memory device illustrated in FIG. 1 according to other example embodiments of inventive concepts.

FIG. 13 is a block diagram of a computer system 400 including the memory device 100 illustrated in FIG. 1 according to other example embodiments of inventive concepts. The computer system 400 may be implemented as a personal computer (PC), a tablet PC, a netbook, an e-reader, a personal digital assistant (PDA), a portable multimedia player (PMP), an MP3 player, or an MP4 player.

The computer system 400 includes a host 410, the memory device 100, a memory controller 420 controlling the data processing operations of the memory device 100, a display 430 and an input device 440.

The host 410 may display data stored in the memory device 100 through the display 430 according to data input through the input device 440. The input device 440 may be implemented by a pointing device such as a touch pad or a computer mouse, a keypad, or a keyboard.

The host 410 may control the overall operation of the computer system 400 and the operations of the memory controller 420. The memory controller 420, which may control the operations of the memory device 100, may be implemented as a part of the host 410 or as a separate chip.

Figure 14:
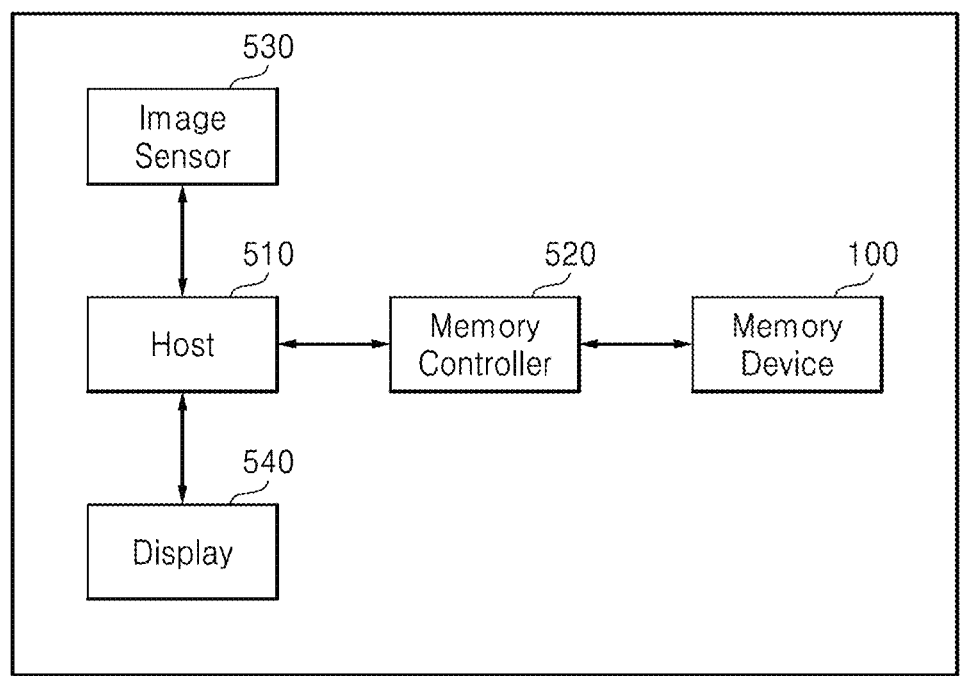
FIG. 14 is a block diagram of a computer system including the memory device illustrated in FIG. 1 according to other example embodiments of inventive concepts.

FIG. 14 is a block diagram of a computer system 500 including the memory device 100 illustrated in FIG. 1 according to other example embodiments of inventive concepts. The computer system 500 may be implemented as an image processor like a digital camera, a cellular phone equipped with a digital camera, a smart phone equipped with a digital camera, or a tablet PC equipped with a digital camera.

The computer system 500 includes a host 510, the memory device 100 and a memory controller 520 controlling the data processing operations, such as a program operation, an erase operation, and a read operation, of the memory device 100. The computer system 500 further includes an image sensor 530 and a display 540. The image sensor 530 included in the computer system 500 converts optical images into digital signals and outputs the digital signals to a host 510 or the memory controller 520. The digital signals may be controlled by the host 510 to be displayed through a display 540 or stored in the memory device 100 through the memory controller 520.

Data stored in the memory device 100 may be displayed through the display 540 according to the control of the host 510 or the memory controller 520. The memory controller 520, which may control the operations of the memory device 100, may be implemented as a part of the host 510 or as a separate chip.

Figure 15:
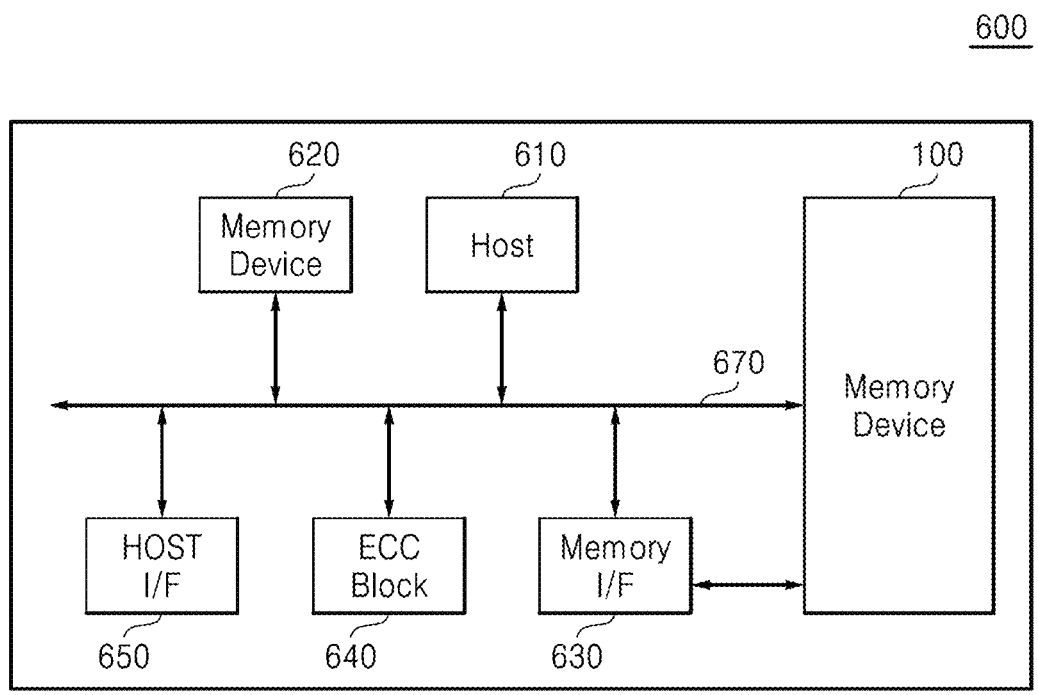
FIG. 15 is a block diagram of a computer system including the memory device illustrated in FIG. 1 according to other example embodiments of inventive concepts.

FIG. 15 is a block diagram of a computer system 600 including the memory device 100 illustrated in FIG. 1 according to yet other example embodiments of inventive concepts. The computer system 600 includes the memory device 100 and a host 610 controlling the operations of the memory device 100. The memory device 100 may be implemented by a non-volatile memory like flash memory. The computer system 600 also includes a system memory 620, a memory interface 630, an error correction code (ECC) block 640 and a host interface 650.

The system memory 620 may be used as an operation memory of the host 610. The system memory 620 may be implemented by a non-volatile memory like read-only memory (ROM) or a volatile memory like static random access memory (SRAM). A host connected with the computer system 600 may perform data communication with the memory device 100 through the memory interface 630 and the host interface 650.

The ECC block 640 is controlled by the host 610 to detect an error bit included in data output from the memory device 100 through the memory interface 630, correct the error bit, and transmit the error-corrected data to the host through the host interface 650. The host 610 may control data communication among the memory interface 630, the ECC block 640, the host interface 650, and the system memory 620 through a bus 670. The computer system 600 may be implemented as a flash memory drive, a USB memory drive, an IC-USB memory drive, or a memory stick.

Figure 16:
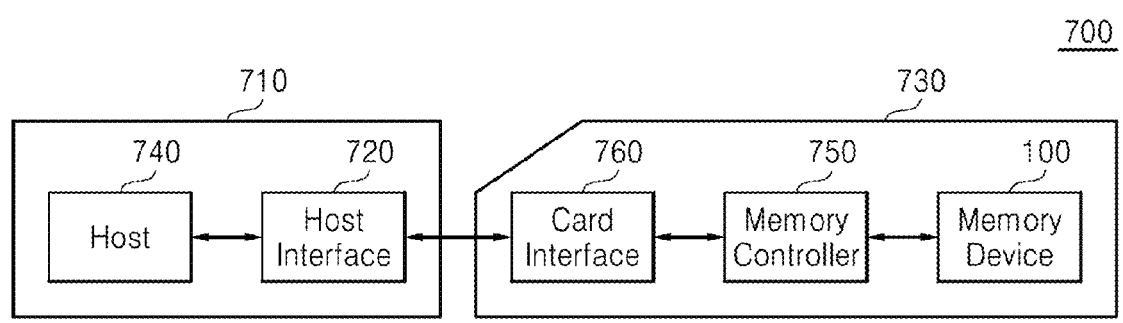
FIG. 16 is a block diagram of a memory system including the memory device illustrated in FIG. 1 according to further example embodiments of inventive concepts.

FIG. 16 is a block diagram of a memory system 700 including the memory device 100 illustrated in FIG. 1 according to further example embodiments of inventive concepts. The memory system 700 may be implemented as a memory card or a smart card.

The memory system 700 includes a host computer 710 and a memory card 730. The host computer 710 includes a host 740 and a host interface 720. The memory card 730 includes the memory device 100, a memory controller 750, and a card interface 760.

The memory controller 750 may control data exchange between the memory device 100 and the card interface 760. The card interface 760 may be a secure digital (SD) card interface or a multi-media card (MMC) interface, but example embodiments of inventive concepts are not restricted to the current example embodiments.

When the memory card 730 is connected with the host computer 710, the card interface 760 may interface the host 740 and the memory controller 750 for data exchange according to a protocol of the host 740. The card interface 760 may support a universal serial bus (USB) protocol and an interchip (IC)-USB protocol. Here, the card interface 760 may indicate a hardware supporting a protocol used by the host 740, a software installed in the hardware, or a signal transmission mode.

When the memory system 700 is connected with the host 740 such as a PC, a tablet PC, a digital camera, a digital audio player, a cellular phone, a console video game hardware, or a digital set-top box, the host interface 720 may perform data communication with the memory device 100 through the card interface 760 and the memory controller 750 according to the host 740.

Figure 17:
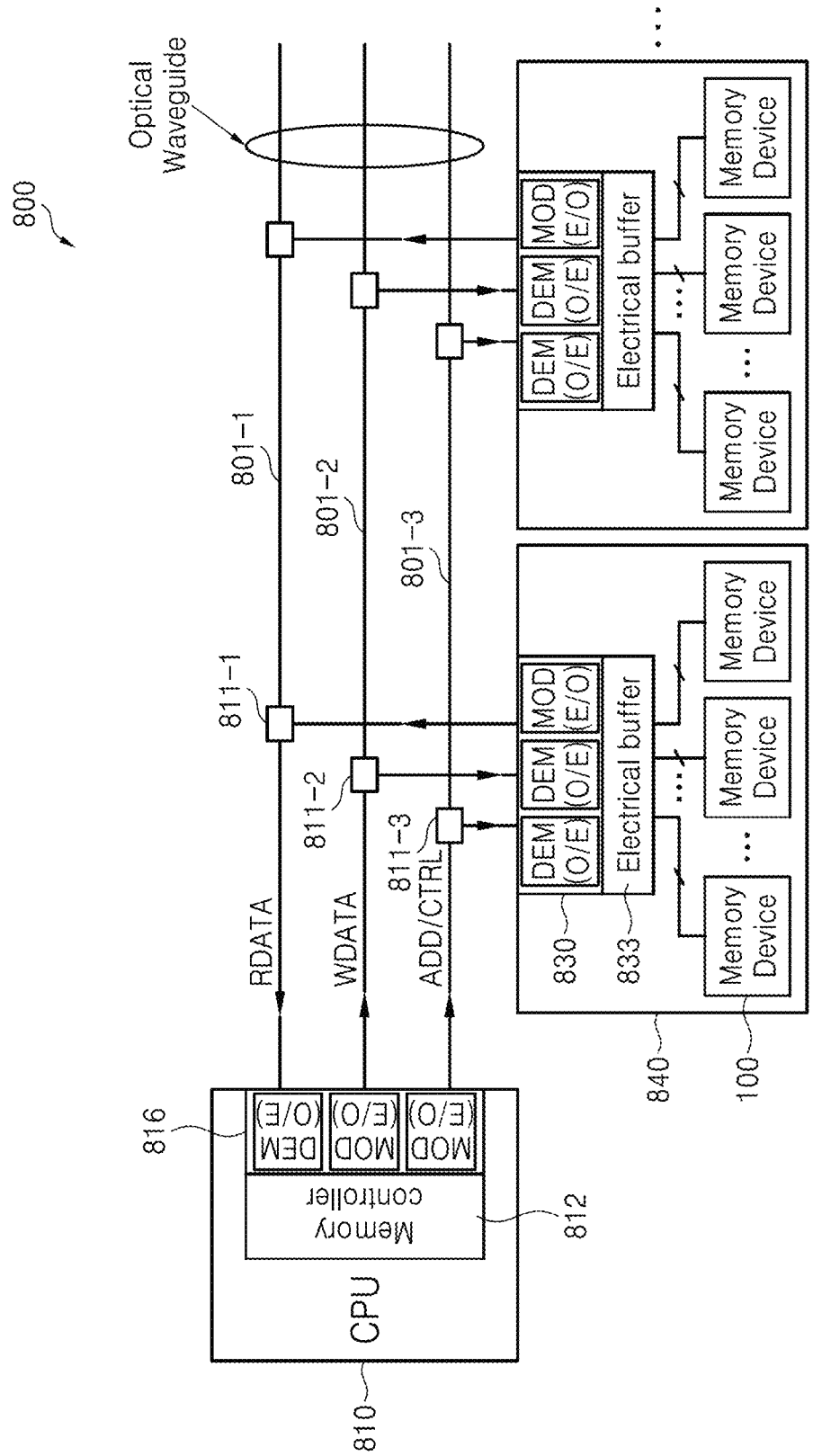
FIG. 17 is a block diagram of a data processing system including the memory device illustrated in FIG. 1 according to some example embodiments of inventive concepts.

FIG. 17 is a block diagram of a data processing system 800 including the memory device illustrated in FIG. 1 according to some example embodiments of inventive concepts. In FIG. 17, MOD(E/O) denotes an optical modulator used as an E/O converter which converts electronic signal to optical signal, and DEM(O/E) denotes an optical demodulator used as an O/E converter which converts optical signal to electronic signal.

Referring to FIG. 17, the data processing system 800 includes a central processing unit (CPU) 810, a plurality of data buses 801-1, 801-2, and 801-3, and a plurality of memory modules 840.

The memory modules 840 transmit and receive optical signals with a de-emphasis waveform through a plurality of couplers 811-1, 811-2, and 811-3 respectively connected to the data buses 801-1 through 801-3. Each of the couplers 811-1 through 811-3 may be implemented by an electrical coupler or an optical coupler.

The CPU 810 includes a first optical transceiver 816, which includes at least one optical modulator MOD(E/0) and at least one optical demodulator DEM(O/E), and a memory controller 812. The optical demodulator DEM(O/E) is used as an O/E converter. The memory controller 812 is controlled by the CPU 810 to control the operations, e.g., the transmitting operation and the receiving operation, of the first optical transceiver 816.

For example, during a write operation, a first optical modulator MOD(E/O) of the first optical transceiver 816 generates a modulated optical signal ADD/CTRL with a de-emphasis waveform from addresses and control signals and transmits the optical signal ADD/CTRL to the data bus 801-3 in compliance with the memory controller 812. After the first optical transceiver 816 transmits the optical signal ADD/CTRL to the data bus 801-3, a second optical modulator MOD(E/O) of the first optical transceiver 816 generates modulated optical write data WDATA having a de-emphasis waveform and transmits the optical write data WDATA to the data bus 801-2.

Each of the memory modules 840 includes a second optical transceiver 830 and a plurality of memory devices 100. Each memory module 840 may be implemented by an optical dual in-line memory module (DIMM), an optical fully buffered DIMM, an optical small outline dual in-line memory module (SO-DIMM), an optical registered DIMM (RDIMM), an optical load reduced DIMM (LRDIMM), an optical unbuffered DIMM (UDIMM), an optical micro DIMM, or an optical single in-line memory module (SIMM).

Referring to FIG. 17, an optical demodulator DEM(O/E) included in the second optical transceiver 830 demodulates the optical write data WDATA received through the data bus 801-2 and transmits a demodulated electrical signal to at least one of the memory devices 100.

Each memory module 840 may also include an electrical buffer 833 which buffers an electrical signal output from an optical demodulator DEM(O/E). For example, the electrical buffer 833 may buffer a demodulated electrical signal and transmits the buffered electrical signal to at least one of the memory devices 100.

During a read operation, an electrical signal output from the memory device 100 is modulated into optical read data RDATA having a de-emphasis waveform by an optical modulator MOD(E/O) included in the second optical transceiver 830. The optical read data RDATA is transmitted to a first optical demodulator DEM(O/E) included in the CPU 810 through the data bus 801-1. The first optical demodulator DEM(O/E) demodulates the optical read data RDATA and transmits a demodulated electrical signal to the memory controller 812.

Figure 18:
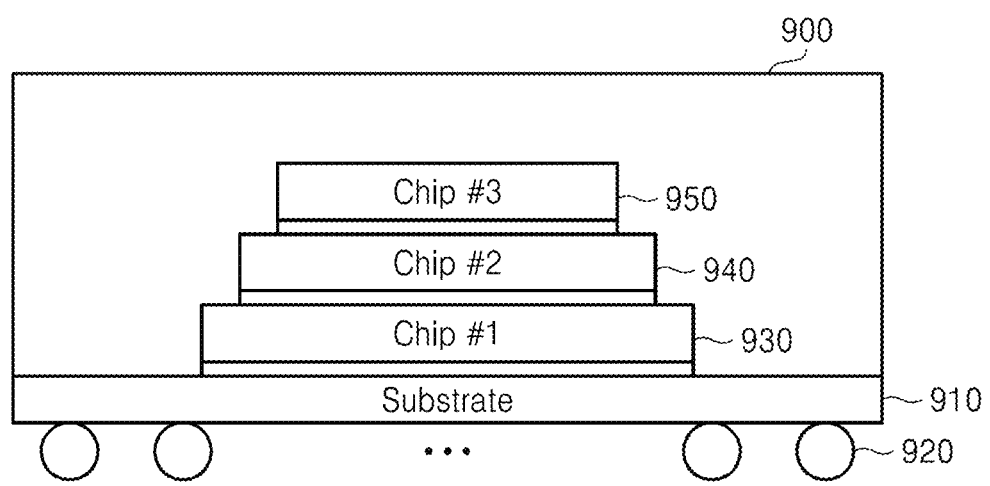
FIG. 18 is a schematic conceptual diagram of a multi-chip package including the semiconductor memory device illustrated in FIG. 1.

FIG. 18 is a schematic conceptual diagram of a multi-chip package 900 including the semiconductor memory device 100 illustrated in FIG. 1. Referring to FIG. 18, the multi-chip package 900 may include a plurality of semiconductor devices, i.e., first through third chips 930, 940, and 950 which are sequentially stacked on a package substrate 910. Each of the semiconductor devices 930 through 950 may include the semiconductor memory device 100. A memory controller (not shown) for controlling the operations of the semiconductor devices 930 through 950 may be included within at least one of the semiconductor devices 930 through 950 or may be implemented on the package substrate 910. A through-silicon via (TSV) (not shown), a bonding wire (not shown), a bump (not shown), or a solder ball 920 may be used to electrically connect the semiconductor devices 930 through 950 with one other.

The first semiconductor device 930 may be a logic die including an input/output interface and a memory controller and the second and third semiconductor devices 940 and 950 may be a die, on which a plurality of memory devices are stacked, and may include a memory cell array. A memory device of the second semiconductor device 940 and a memory device of the third semiconductor device 950 may be the same or different types of memory.

Alternatively, each of the first through third semiconductor devices 930 through 950 may include a memory controller. The memory controller may be on the same die as a memory cell array or may be on a different die than the memory cell array.

As another alternative, the first semiconductor device 930 may include an optical interface. A memory controller may be positioned in the first or second semiconductor device 930 or 940 and a memory device may be positioned in the second or third semiconductor device 940 or 950. The memory device may be connected with the memory controller through a TSV.

The multi-chip package 900 may be implemented using hybrid memory cube (HMC) in which a memory controller and a memory cell array die are stacked. When the HMC is used, the performance of memory devices increases due to the increase of bandwidth and the area of the memory devices is reduced or minimized. As a result, power consumption and manufacturing cost can be reduced.

Figure 19:
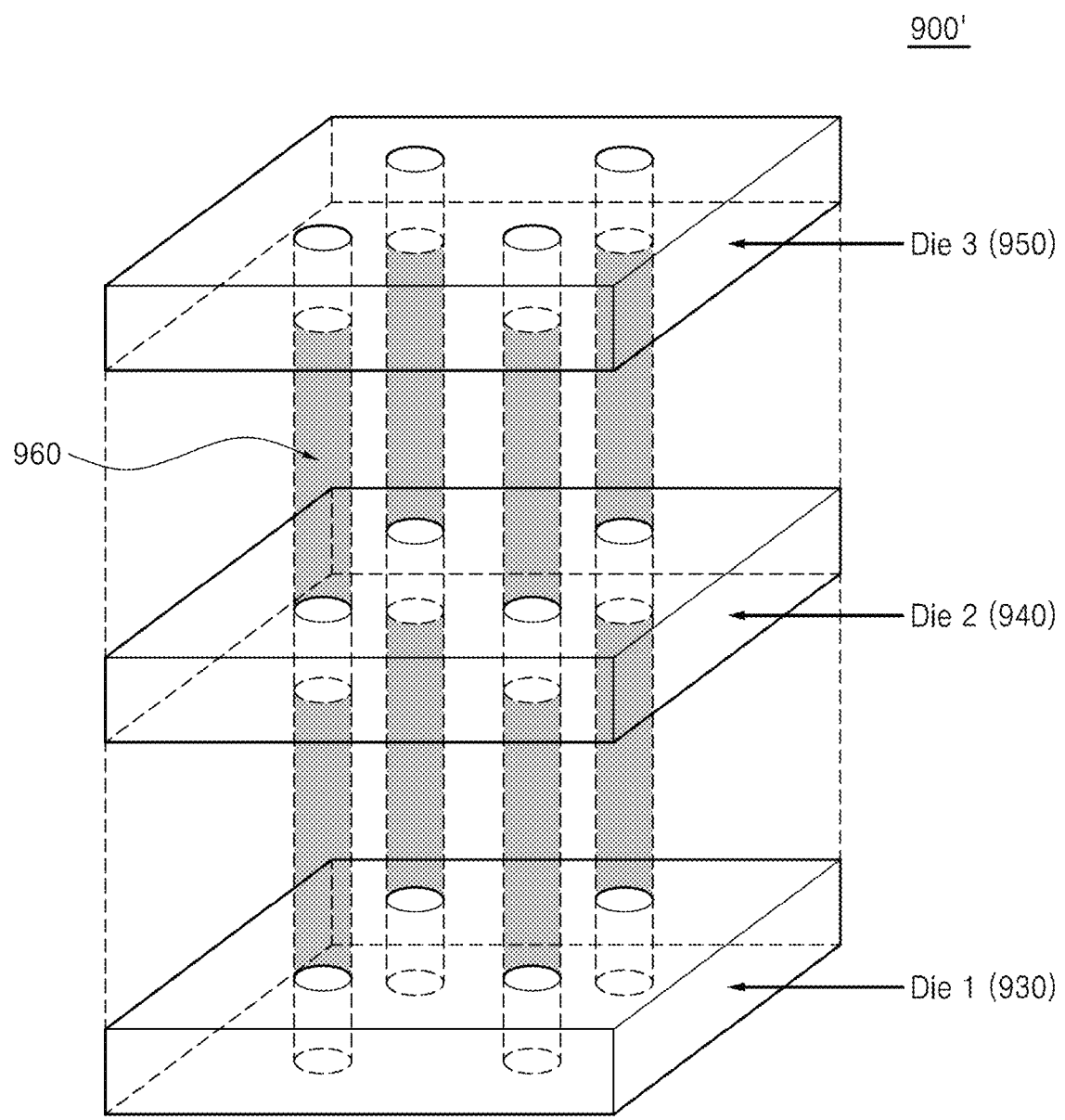
FIG. 19 is a three-dimensional conceptual diagram of an example of the multi-chip package illustrated in FIG. 18.

FIG. 19 is a three-dimensional conceptual diagram of an example of the multi-chip package 900 illustrated in FIG. 18. Referring to FIG. 19, the multi-chip package 900' includes a plurality of the dies 930 through 950 connected with one another through TSVs 960 in a stack structure. Each of the dies 930 through 950 may include a plurality of circuit blocks (not shown) and a periphery circuit to realize the functions of the semiconductor memory device 100. The dies 930 through 950 may be referred to as a cell array. The plurality of circuit blocks may be implemented by memory blocks.

The TSVs 960 may be formed of a conductive material including a metal such as copper (Cu). The TSVs 960 are arranged at the center of a silicon substrate. The silicon substrate surrounds the TSVs 960. An insulating region (not shown) may be disposed between the TSVs 960 and the silicon substrate.

The present example embodiments of inventive concepts can also be embodied as computer-readable codes on a computer-readable medium. The computer-readable recording medium is any data storage device that can store data as a program which can be thereafter read by a computer system. Examples of the computer-readable recording medium include read-only memory (ROM), random-access memory (RAM), CD-ROMs, magnetic tapes, floppy disks, and optical data storage devices.

The computer-readable recording medium can also be distributed over network coupled computer systems so that the computer-readable code is stored and executed in a distributed fashion. Also, functional programs, codes, and code segments to accomplish the present example embodiments of inventive concepts can be easily construed by programmers.

As described above, according to some example embodiments of inventive concepts, a refresh operation is frequently performed on a cell with high disturbance in a memory device and a memory system, thereby improving the refresh characteristics of the memory cell and increasing the data reliability of the memory device.

While example embodiments of inventive concepts have been particularly shown and described with reference to example embodiments thereof, it will be understood by those of ordinary skill in the art that various changes in forms and details may be made therein without departing from the spirit and scope of example embodiments of inventive concepts as defined by the following claims.

What is claimed is:

1. A method of operating a memory device including a plurality of memory cells, the plurality of memory cells including a first memory cell and a second memory cell neighboring the first memory cell, the method comprising:
   counting a number of disturbances associated with the second memory cell each time the first memory cell is accessed;
   updating a disturbance count value of the second memory cell based on the counting;
   adjusting a refresh schedule based on the disturbance count value of the second memory cell, a desired threshold and a maximum disturbance count value, the adjusted refresh schedule at least indicating that, if the second memory cell is flagged, an irregular refresh operation is performed on the second memory cell prior to performing a regular refresh operation on the first memory cell and the second memory cell, the second memory cell being flagged when the disturbance count value associated with the second memory cell is above the desired threshold or the maximum disturbance count value; and
   resetting the disturbance count value of the second memory cell and the maximum disturbance count value when the second memory cell is refreshed according to the adjusted refresh schedule.

2. The method of claim 1, wherein the number of disturbances associated with the second memory cell is a cumulative access time of the first memory cell divided by a unit time.

3. The method of claim 1, wherein the updating includes adding a disturbance count value stored at a previous access time to the number of disturbances counted during a current access time of the first memory cell each time the first memory cell is accessed.

4. The method of claim 1, wherein the adjusting the refresh schedule comprises:
   advancing the irregular refresh operation on the second memory cell in the refresh schedule if the disturbance count value of the second memory cell is at least the desired threshold and is greater than the maximum disturbance count value; and
   updating the maximum disturbance count value with the disturbance count value of the second memory cell.

5. The method of claim 1, wherein the resetting the disturbance count value comprises:
   enabling an irregular refresh flag after the memory device is powered up to control the memory device to perform the irregular refresh operation according to the refresh schedule; and
   disabling the irregular refresh flag if the memory device is in a test mode to stop the irregular refresh operation.

6. The method of claim 5, wherein the irregular refresh flag is reset when the second memory cell is refreshed.

7. The method of claim 1, further comprising:
   initializing the disturbance count value when the memory device is powered up.

8. The method of claim 1, further comprising:
   entirely refreshing the plurality of memory cells based on a power up signal; and
   outputting an internal refresh signal to control initialization of the disturbance count value.

9. A memory device comprising:
   a memory cell array including a plurality of memory cells, the plurality of memory cells including a first memory cell and a second memory cell neighboring the first memory cell;
   a control logic configured to,
      read a disturbance count value of the second memory cell if the first memory cell is accessed,
      compare the disturbance count value with a desired threshold and a maximum disturbance count value,
      count a number of disturbances associated with the second memory cell during a current access time of the first memory cell, and
      update the disturbance count value based on the counting; and
   a refresh unit configured to,
      calculate a word line address of the second memory cell,
      adjust a current refresh schedule for the second memory cell according to a result of the comparison of the disturbance count value such that, if the second memory cell is flagged, the adjusted refresh schedule at least indicating that an irregular refresh operation is performed on the second memory cell prior to performing a regular refresh operation on the first memory cell and the second memory cell, the second memory cell being flagged when the disturbance count value associated with the second memory cell is above the desired threshold or the maximum disturbance count value, perform the irregular refresh operation and the regular refresh operation on the first memory cell and the second memory cell according to the adjusted refresh schedule, and control initialization of the disturbance count value based on a power up signal.

10. The memory device of claim 9, wherein the memory cell array comprises:

a normal cell array including a plurality of data memory cells configured to store data, the data memory cells including the first memory cell and the second memory cells; and a disturbance count cell array including a plurality of disturbance count cells configured to store the disturbance count value, wherein, at least one of the disturbance count cells is connected to a same word line as the first memory cell.

11. The memory device of claim 10, further comprising:
a count write/read block configured to,
read the disturbance count value of the second memory cell from the disturbance count cell, and
write the updated disturbance count value to the disturbance count cell.

12. The memory device of claim 9, wherein the control logic comprises:

an address command decoder configured to,
receive a clock signal, an active command, and an address from a host,
decode the active command and the address based on the clock signal to generate control signals corresponding to the active command, and
generate a row address and a column address for accessing the first memory cell;

a count value comparator configured to compare the current disturbance count value with the desired threshold and the maximum disturbance count value;

a count value updater configured to update the disturbance count value by adding a disturbance count value stored at a previous access time to the number of disturbances counted during the current access time of the first memory cell each time the first memory cell is accessed; and a maximum count value storage configured to,
store the maximum disturbance count value among disturbance count values of the second memory cell from a time of initialization of the memory device to a current operating time, and
update the maximum disturbance count value with the updated disturbance count value if the updated disturbance count value is greater than the maximum disturbance count value.

13. The memory device of claim 12, wherein the count value updater is configured to reset the disturbance count value of the second memory cell after the irregular refresh operation is performed on the second memory cell.

14. The memory device of claim 9, wherein the refresh unit comprises:

an adjacent address calculator configured to calculate an address of the second memory cell based on an address of the first memory cell, the address of the first memory cell being received from the control logic;

a next irregular refresh address and irregular refresh flag storage configured to,
store the address of the second memory cell as a next irregular refresh address if the disturbance count value of the second memory cell is at least the desired threshold or is greater than the maximum disturbance count value, and
store an irregular refresh flag indicating if the irregular refresh operation will be performed on the second memory cell; and a refresh controller configured to adjust the refresh schedule such that, when performing the irregular refresh operation, the refresh controller prioritizes the second memory cell according to the irregular refresh flag.

15. The memory device of claim 14, wherein
the refresh unit further includes a periodic internal refresh command generator configured to entirely refresh the memory cell array based on the power up signal and to output an internal refresh signal for controlling the disturbance count value to be initialized, and
the control logic includes a count valid flag unit configured to enable a count valid flag according to the internal refresh signal to reset a count value updater, a count value comparator, and a maximum count value storage.

16. The memory device of claim 15, wherein the count valid flag unit is configured to disable the count valid flag when the memory device is in a test mode so that the irregular refresh operation on the second memory cell is not performed.

17. The memory device of claim 14, wherein the refresh controller is configured to insert the irregular refresh operation on the second memory cell into the refresh schedule so that the irregular refresh operation on the second memory cell is performed by priority if the disturbance count value of the second memory cell is at least the desired threshold and is greater than the maximum disturbance count value.

18. The memory device of claim 14, wherein the refresh controller is configured to adjust the refresh schedule so that the irregular refresh operation on the second memory cell is performed to keep pace with the refresh schedule if the disturbance count value of the second memory cell is at least the desired threshold and is greater than the maximum disturbance count value.

19. The memory device of claim 9, wherein the refresh unit further comprises:

a periodic internal refresh command generator configured to entirely refresh the memory cell array based on the power up signal and to output an internal refresh signal to control initialization of the disturbance count value.

20. A method of operating a memory system including a plurality of memory cells, the plurality of memory cells including at least one first memory cell and a second memory cell neighboring a word line of the at least one first memory cell, the method comprising:

counting a number of disturbances associated with the second memory cell each time the at least one first memory cell is accessed, the number of disturbances being obtained by periodically increasing a counter during a cumulative access time of the at least one first memory cell;

updating a disturbance count value of the second memory cell based on the counting;

adjusting a sequence of a refresh operation on the second memory cell based on the updated disturbance count value, a maximum disturbance count value and a desired threshold, the adjusting adjusting the sequence such that, if the second memory cell is flagged, an irregular refresh operation is performed prior to performing a regular refresh operation on the at least one first memory cell and the second memory cell, the second memory cell being flagged when the disturbance count value associated with the second memory cell is above the desired threshold or the maximum disturbance count value; and resetting the disturbance count value of the second memory cell when the refresh operation including the irregular refresh operation and the regular refresh operation on the second memory cell is performed according to the sequence.

21. The method of claim 20, wherein the adjusting the sequence comprises:

scheduling the irregular refresh operation on the second memory cell such that the second memory cell is prioritized if the disturbance count value of the second memory cell is at least the desired threshold and is greater than the maximum disturbance count value;

updating the maximum disturbance count value with the disturbance count value of the second memory cell; and updating an irregular refresh flag indicating whether to perform the irregular refresh operation on the second memory cell.

22. The method of claim 21, wherein if the irregular refresh flag is enabled, the method further comprises:

performing the irregular refresh operation on the second memory cell; and resetting the irregular refresh flag after resetting the maximum disturbance count value of the second memory cell and the disturbance count value of the second memory cell.

23. The method of claim 20, further comprising:

resetting all disturbance count values by enabling all word lines in the memory system when the memory system is powered up.

24. The method of claim 20, further comprising:

entirely refreshing the plurality of memory cells based on a power up signal; and outputting an internal refresh signal to control initialization of the disturbance count value.

25. A method of operating a memory device including a plurality of memory cells, the plurality of memory cells including at least one target memory cell and remaining memory cells, the method comprising:

counting, as a disturbance count value, a number of disturbances associated with each of the remaining memory cells while the at least one target memory cell is accessed;

changing a sequence of a refresh operation including an irregular refresh operation and a regular refresh operation on each of the remaining memory cells based on the disturbance count value, the sequence of the refresh operation at least indicating that, for respective ones of the remaining memory cells that are flagged, the irregular refresh operation is performed prior to performing the regular refresh operation on the at least one target memory cell and the remaining memory cells, the remaining memory cells being flagged when the disturbance count value associated with the remaining memory cells is above a desired threshold or a maximum disturbance count value; and resetting the disturbance count value of the remaining memory cells on which the refresh operation has been performed.

26. The method of claim 25, wherein, for each of the remaining memory cells, the counting the number of disturbances comprises:

accumulating a value resulting from counting an access time of the target memory cell since a previous refresh operation on a respective one of the remaining memory cells.

27. The method of claim 25, wherein the changing the sequence of the refresh operation includes, if one of the disturbance count values is equal to the desired threshold and is greater than the maximum disturbance count value:

scheduling the irregular refresh operation such that the sequence prioritizes ones of the remaining memory cells according to the disturbance count value;

updating the maximum disturbance count value with the disturbance count value; and updating an irregular refresh flag for the ones of the remaining memory cells.

28. The method of claim 27, wherein the resetting the disturbance count value comprises:

performing the refresh operation on each of the remaining memory cells when the irregular refresh flag is enabled according to the scheduling; and disabling the irregular refresh flag for each of the remaining memory cells after resetting the maximum disturbance count value and the disturbance count value of each of the remaining memory cells.

29. The method of claim 25, further comprising:

entirely refreshing the plurality of memory cells based on a power up signal; and outputting an internal refresh signal to control initialization of the disturbance count value.

30. A method of operating a memory device including a plurality of memory cells, the plurality of memory cells including a first memory cell and one or more second memory cells, the method comprising:

calculating a number of disturbances associated with the first memory cell neighboring a word line of the one or more second memory cells, the number of disturbances associated indicating a disturbance value of the first memory cell due to an access of the one or more second memory cells;

updating a disturbance count value of the first memory cell by adding the number of disturbances associated with the first memory cell to the disturbance count value each time the one or more second memory cells are accessed;

flagging the first memory cell as needing to be refreshed via an irregular refresh operation if the disturbance count value is above a desired threshold or a maximum disturbance count value; and adjusting a refresh schedule to perform the irregular refresh operation and a regular refresh operation on the plurality of memory cells such that, if the first memory cell is flagged, the adjusting adjusts the refresh schedule to indicate that the irregular refresh operation is performed on the first memory cell prior to performing the regular refresh operation on the first memory cell and the one or more second memory cells.

31. The method of claim 30, wherein the number of disturbances associated with the first memory cell is a cumulative access time of the one and more second memory cells divided by a unit time.

32. The method of claim 30, wherein the flagging further comprises:

flagging the first memory cell as needing to be refreshed if the disturbance count value is above the maximum disturbance count value; and updating the maximum disturbance count value with the disturbance count value of the first memory cell.

33. The method of claim 32, further comprising:

performing the irregular refresh operation on the first memory cell if the first memory cell is flagged;

resetting the disturbance count value of the first memory cell after performing the irregular refresh operation on the first memory cell; and resetting the maximum disturbance count value after performing the irregular refresh operation on the first memory cell if the maximum disturbance count value was updated with the disturbance count value of the first memory cell.

34. The method of claim 30, further comprising:

entirely refreshing the plurality of memory cells based on a power up signal; and outputting an internal refresh signal to control initialization of the disturbance count value.

\* \* \* \* \*